(12) United States Patent
Anan et al.

(10) Patent No.: US 6,467,064 B1
(45) Date of Patent: Oct. 15, 2002

(54) VITERBI DECODER

(75) Inventors: Taizo Anan; Akira Nakagawa; Eishi Morimatsu, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/464,210

(22) Filed: Dec. 15, 1999

(30) Foreign Application Priority Data

Mar. 19, 1999 (JP) .......................................... 11-076781

(51) Int. Cl.[7] ........................ H03M 13/23; H03M 13/41
(52) U.S. Cl. ........................................ 714/795; 714/796
(58) Field of Search ................................ 714/795, 796

(56) References Cited

U.S. PATENT DOCUMENTS

| | | | | |
|---|---|---|---|---|
| 4,583,078 A | * | 4/1986 | Shenoy et al. | 341/51 |
| 5,220,570 A | * | 6/1993 | Lou et al. | 341/107 |
| 5,345,452 A | * | 9/1994 | Matui | 360/45 |
| 5,384,810 A | * | 1/1995 | Amrany | 375/340 |
| 5,424,882 A | * | 6/1995 | Kazawa | 360/46 |
| 5,428,631 A | * | 6/1995 | Zehavi | 375/308 |
| 5,432,803 A | * | 7/1995 | Liu et al. | 375/340 |
| 5,710,784 A | * | 1/1998 | Kindred et al. | 375/262 |
| 5,742,621 A | * | 4/1998 | Amon et al. | 708/211 |
| 5,912,908 A | * | 6/1999 | Cesari et al. | 341/200 |
| 5,931,966 A | * | 8/1999 | Carley | 360/39 |
| 5,970,104 A | * | 10/1999 | Zhong et al. | 375/341 |
| 5,991,341 A | * | 11/1999 | Shin | 348/608 |

FOREIGN PATENT DOCUMENTS

| | | |
|---|---|---|
| JP | 2-170726 | 7/1990 |
| JP | 7-30438 | 1/1995 |
| JP | 7-147546 | 6/1995 |
| JP | 8-32456 | 2/1996 |
| JP | 8-279765 | 10/1996 |
| JP | 9-139678 | 5/1997 |

* cited by examiner

*Primary Examiner*—Stephen M. Baker
(74) *Attorney, Agent, or Firm*—Katten Muchin Zavis Rosenman

(57) ABSTRACT

A Viterbi decoder for decoding a receive signal series encoded by an error correcting code is disclosed. The Viterbi decoder comprises a storage unit for storing a plurality of branch metrics, and a control unit for performing, upon receipt of the receive signal series, the processing of selecting a surviving path for each status using the branch metrics stored in the storage unit. The memory is prepared in accordance with the pattern of the receive signal series for storing a plurality of tables holding the branch metrics corresponding to each status. Each table holds the branch metrics in such a manner that the branch metrics of the two branches entering each status may be read by the control unit in the order of the branches constituting a trellis.

8 Claims, 22 Drawing Sheets

FIG. 4

DEFINITION OF CHARACTERS IN FLOWCHART OF FIG. 3

DEFINITION:
$s_k^t$ : STATUS k AT TIME POINT t
$b_{2k}^t, b_{2k+1}^t$ : BRANCH EXTENDING TO PAST FROM STATUS $s_k^t$
$s_{b_{2k}}^{t-1}, s_{b_{2k+1}}^{t-1}$ : STATUS ONE UNIT TIME BEFORE BRANCHES $b_{2k}^t, b_{2k+1}^t$ ARE CONNECTED RESPECTIVELY

EXAMPLES:
$s_0^1$ : TIME 1, STATUS 0
$b_0^1, b_1^1$ : BRANCH EXTENDING TO PAST FROM $s_0^1$
$s_{b_0}^0 = s_0^0, s_{b_1}^0 = s_2^0$ : STATUS ONE UNIT TIME BEFORE BRANCHES $b_0^1, b_1^1$ ARE CONNECTED

FIG. 16

| RECEIVE SIGNAL SERIES 00 | RECEIVE SIGNAL SERIES 01 | RECEIVE SIGNAL SERIES 10 | RECEIVE SIGNAL SERIES 11 |
|---|---|---|---|
| S0 BRANCH 0, 1=−1 | S0 BRANCH 0, 1=0 | S0 BRANCH 0, 1=0 | S0 BRANCH 0, 1=1 |
| S1 BRANCH 2, 3=0 | S1 BRANCH 2, 3=−1 | S1 BRANCH 2, 3=1 | S1 BRANCH 2, 3=0 |
| S2 BRANCH 4, 5=−1 | S2 BRANCH 4, 5=0 | S2 BRANCH 4, 5=0 | S2 BRANCH 4, 5=1 |
| S3 BRANCH 6, 7=0 | S3 BRANCH 6, 7=−1 | S3 BRANCH 6, 7=1 | S3 BRANCH 6, 7=0 |

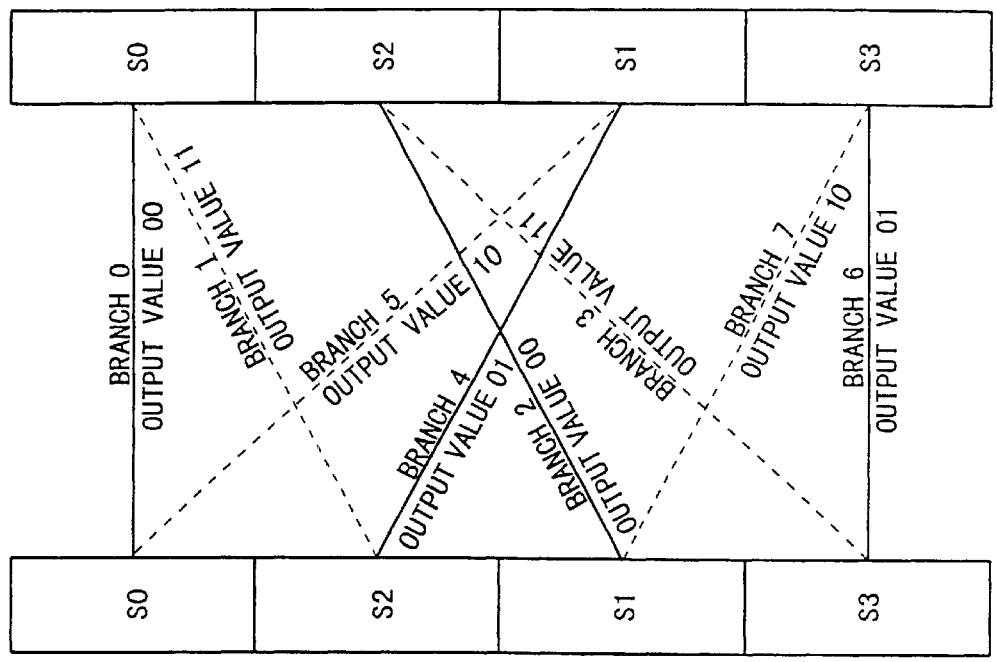
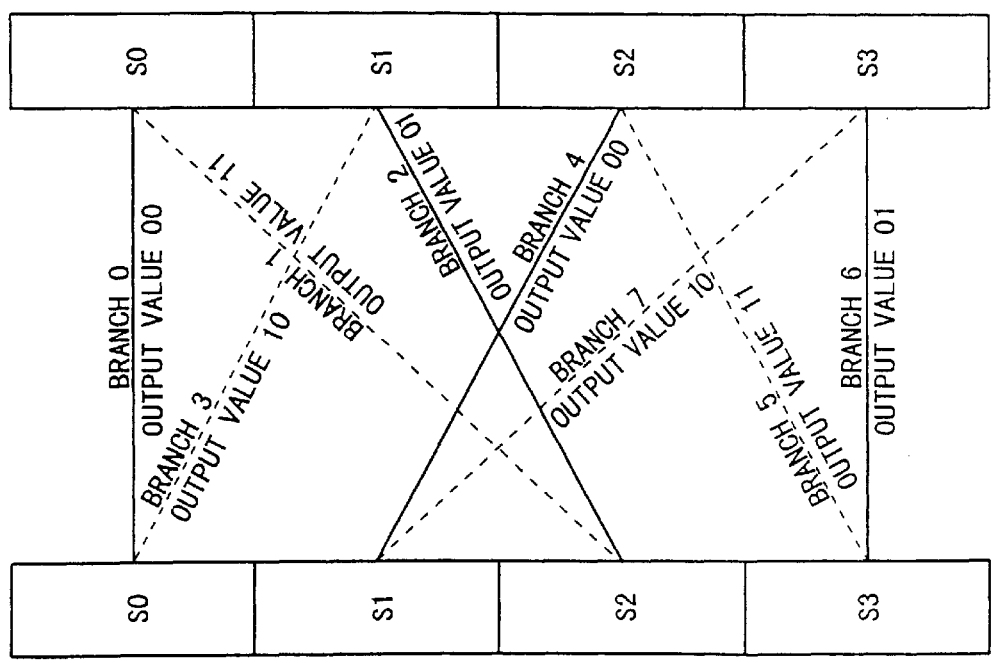
FIG. 21

VITERBI DECODER

BACKGROUND OF THE INVENTION

1. Field of the Invention

The present invention relates to a Viterbi decoder for decoding the receive signal series encoded with an error correcting code by the operation of a processor in the method for decoding the error correcting code.

2. Description of the Prior Art

In the fields of communication and information processing, the reliability of communication and information processing, as the case may be, is required to be improved. For this purpose, a technique using "error correcting code" has been proposed to assure correct receipt at the receiving end of the signals transmitted from the transmitting end. In recent years, a high-performance decoding method for the error correcting code has been required. One of the most effective method of decoding the error correcting code is the Viterbi decoding method which is a maximum likelihood decoding method for the receive signal series containing the error correcting code. This method has an especially superior ability of error correction, and therefore has been widely used.

An example of the Viterbi decoding method will be described. FIG. 22 is a diagram showing an example of the trellis used in the Viterbi decoding method. In the Viterbi decoding method, the maximum likelihood decoding is executed using the trellis shown in FIG. 22.

In FIG. 22, two branches entering each status Sk (k=0, 1, 2, . . . ) each have a value called a branch output. Also, the numerical value described under each status Sk is called a path metric which is the minimum sum of the branch metrics leading to the status Sk.

Assume, for example, that the current time is T1. First, in the status S0, the branch metric (humming distance) between each of the two branches (branch 0 and branch 1) entering the status S0 on the one hand and the receive signal series on the other is calculated.

Once the branch metrics (branch 0=1, branch 1=1) of branches 0, 1 are determined, the path metric of the status S0 with the branch 0 connected to the time point T0 one unit time before is used (which is conventionally preserved in a memory equipment), and added to the branch metric of the branch 0 as a value P1. Specifically, P1=branch metric of branch 0 (=1)+path metric of status S0 (=2)=3 is determined. In similar fashion, the sum P2 of the path metric of the status S2 with the branch 1 connected to T0 one unit time before and the branch metric of the branch 1 is determined. Specifically, P2=branch metric of branch 0 (=1)+path metric of status S2 (=101)=102 is determined.

Then, 21 and P2 are compared with each other, the smaller one of them (P1=3) is stored as a path metric for the status S0 at time point T1. Also, in FIG. 22, the selected branch 0 transfers from the status S0 one time unit before, and therefore the information bit "0" is input and stored. In the trellis shown in FIG. 22, thick solid lines indicate the path selected by the technique mentioned above.

After the forgoing processing has been executed for all the status Sk (k=0, 1, 2, . . . ) and all the time points, assume that the trellis is known to end at the status S3 at time point T2 by the negotiation beforehand between the transmitting and receiving ends. The thick surviving path of the trellis traced (called the back trace) toward time point T0 from the status S3 at the final time point T2. The decoded signal series can be output in the direction reverse to the input, if the bit "0" is output for a thick solid line and "1" for a thick dashed line.

As described above, in the Viterbi decoding method, the code series considered most likely to have been transmitted from the transmitting end is estimated thereby to eliminate the error in the transmission path.

The Viterbi decoder for realizing the Viterbi decoding method described above has already been proposed. The recent trend is toward the Viterbi decoder being configured not simply with hardware but with software (firmware) and a processor. In the case where the Viterbi decoder is realized using software, the processing speed is unavoidably reduced than in hardware, and therefore the amount of operation (processing amount) is required to be reduced. Especially, the maximum likelihood decoding method such as the Viterbi decoding method involves a comparatively large amount of operation, which must be reduced as far as possible.

Fujitsu Ltd. has proposed a Viterbi decoder for realizing the Viterbi decoding scheme with the operation using the processor (Japanese Patent Application Laid-Open No. 7-30438, hereinafter referred to as the prior art). In the prior art, in order to calculate the branch metric, branch metrics corresponding to the receive signal series are held as a table, and upon receipt of the receive signal series, an address is calculated from the receive signal series for accessing the table of the branch metrics. Then the branch metric corresponding to the address is read from the table, thereby reducing the operation amount required for calculating the branch metric.

In the prior art which is configured to read the branch metric from the table by random access, however, the operation for generating an address is required each time the branch metric is read, thereby posing the problem of the long time required for calculation of the branch metric.

Also, the branch metrics held in the table beforehand is so vast in amount that the storage capacity of the memory for storing the table is unavoidably increased.

SUMMARY OF THE INVENTION

The object of the present invention is to provide a Viterbi decoder in which the time required for calculating the branch metric can be shortened and the memory capacity required for the table used to calculate the branch metric can be reduced.

According to a first aspect of the invention, there is provided a Viterbi decoder for decoding the receive signal series encoded with an error correcting code, comprising a storage unit for storing a plurality of branch metrics, and a control unit for selecting a surviving path for each status using the branch metrics stored in the storage unit upon receipt of the receive signal series, wherein the storage unit is prepared in beforehand accordance with the pattern of the receive signal series and stores a plurality of tables holding the branch metrics corresponding to each status. Each table holds the branch metrics in such a manner that the branch metrics of the two branches entering each status are read by the control unit in the order of the branches constituting the trellis.

According to a second aspect of the invention, there is provided a Viterbi decoder for decoding the receive signal series encoded by an error correcting code, comprising a storage unit for storing a plurality of branch metrics, and a control unit for selecting a surviving path for each status using the branch metrics stored in the storage unit upon receipt of the receive signal series, wherein the storage unit is prepared beforehand in accordance with the pattern of the receive signal series and stores a plurality of tables holding the branch metrics corresponding to each status. In the case where the branch metric of one of the two branches entering a given status can be calculated by the branch metric of the other branch, each table holds only one of the branch metrics. In the case where the branch metric of only one of the two branches entering a given status is read from the table corresponding to the receive signal series, the control unit determines the other branch metric from the particular one branch metric.

For example, assuming that the output values of the two branches entering a given status are codes with bits of inverted signs, each table holds the branch metric of only one of the branches.

According to a third aspect of the invention, there is provided a Viterbi decoder for decoding the receive signal series encoded by an error correcting code, comprising a storage unit for storing a plurality of branch metrics, and a control unit for selecting a surviving path for each status by calculating the path metrics corresponding to the two branches entering each status using the branch metrics stored in the storage unit upon receipt of the receive signal series, wherein the storage unit is prepared in beforehand accordance with the pattern of the receive signal series and stores a plurality of tables holding the branch metrics corresponding to each status. Each table holds only one of the branch metrics of the two branches entering each status converted to be symmetric about zero (opposite signs of positive and negative), as a branch metric corresponding to the particular status. In the case where only one of the branch metrics of the two branches symmetric about zero is read from the table corresponding to the receive signal series, the control unit calculates the path metric corresponding to the two branches entering each status using the particular one branch metric.

According to a fourth aspect of the invention, there is provided a Viterbi decoder for decoding the receive signal series encoded by an error correcting code, comprising a storage unit for storing a plurality of branch metrics, and a control unit for selecting a surviving path for each status by calculating the path metrics corresponding to the two branches entering each status using the branch metrics stored in the storage unit upon receipt of the receive signal series, wherein the storage unit is prepared in beforehand accordance with the pattern of the receive signal series and stores a plurality of tables holding the branch metrics corresponding to each status. As a branch metric corresponding to each status, each table holds only one of the branch metrics of the two branches entering a given status from which the branch metric of the other branch can be determined, and further holds adjoining status having the same branch metric in a group. The control unit reads the grouped branch metrics from the table corresponding to the receive signal series, and calculates the path metric for each status corresponding to the branch metric thus read.

According to a fifth aspect of the invention, there is provided a Viterbi decoder for decoding the receive signal series encoded by an error correcting code, comprising a storage unit for storing a plurality of branch metrics, and a control unit for selecting a surviving path for each status by calculating the path metrics corresponding to the two branches entering each status using the branch metrics stored in the storage unit upon receipt of the receive signal series, wherein the storage unit is prepared in beforehand accordance with the pattern of the receive signal series and stores a plurality of tables holding the branch metrics corresponding to each status. As a branch metric corresponding to each status, each table holds only one of the branch metrics of the two branches entering a given status from which the branch metric of the other branch can be determined, and further holds adjoining status having the branch metrics of opposite signs of positive and negative in a group. The control unit reads the grouped branch metrics from the table corresponding to the receive signal series, and calculates the path metric for each status corresponding to the branch metric thus read.

According to a sixth aspect of the invention, there is provided a Viterbi decoder for decoding the receive signal series encoded by an error correcting code, comprising a storage unit for storing a plurality of branch metrics, and a control unit for selecting a surviving path for each status by calculating the path metrics corresponding to the two branches entering each status using the branch metrics stored in the storage unit upon receipt of the receive signal series, wherein the storage unit is prepared in beforehand accordance with the pattern of the receive signal series and stores a plurality of tables holding the branch metrics corresponding to each status. As a branch metric corresponding to each status, each table holds only one of the branch metrics of the two branches entering a given status from which the branch metric of the other branch can be determined, and further holds branches not having adjoining status but having the same branch metrics in a group in the case where adjoining status neither have the same branch metric nor have branch metrics of opposite signs of positive and negative. The control unit reads the grouped branch metrics from the table corresponding to the receive signal series, and calculates the path metric for each status corresponding to the branch metric thus read.

According to a seventh aspect of the invention, there is provided a Viterbi decoder for decoding the receive signal series encoded by an error correcting code, comprising a storage unit for storing a plurality of branch metrics, and a control unit for selecting a surviving path for each status using the branch metrics stored in the storage unit upon receipt of the receive signal series, wherein the storage unit stores a table shared by a specific receive signal series and a receive signal series having a pattern inverted-from that of the specific receive signal series, and wherein the control unit, upon receipt of the specific receive signal series or the receive signal series inverted from the first receive signal series, reads the branch metrics stored in the table and selects a surviving path for each status.

According to an eighth aspect of the invention, there is provided a Viterbi decoder for decoding the receive signal series encoded by an error correcting code, comprising a storage unit for storing a plurality of branch metrics, and a control unit for selecting a surviving path for each status by calculating the path metric corresponding to the two branches entering each status using the branch metrics stored in the storage unit upon receipt of the receive signal series, wherein in the case where the trellis determined by the negotiation with the transmitting end of the receive signal series and applied to the decoding of the receive signal series is such that the branch metric for each status corresponding to the receive signal series input to the control unit cannot be read by sequential access from the storage unit, the control unit converts the structure of the trellis into a state in which the branch metric can be read by sequential access, and produces a table holding the branch metric for each status corresponding to the trellis having the converted structure.

A Viterbi decoder according to this invention has a structure in which the branch metric table is accessible sequentially. As a result, the time required for reading the branch metrics from the branch metric table is shortened and so is the time required for calculating the path metrics.

Also, in a Viterbi decoder according to the invention, the branch metric table holds a plurality of branch metrics in a group. As a result, the number of times the branch metric table is accessed is reduced. Thus, both the amount of operation of the path metrics and the storage capacity of the branch metric memory can be reduced.

Also, in a Viterbi decoder according to the invention, the values of the branch metrics of the branches entering a given status are symmetric about zero. As a result, the amount of operation of the path metrics requiring repetitive calculations is reduced and so is the storage capacity of the branch metric memory.

As described above, with a Viterbi decoder according to this invention, the amount of operation for selecting a surviving path can be reduced. As a result, the time required for decoding the receive signal series can be shortened and so is the storage capacity of the branch metric memory.

BRIEF DESCRIPTION OF THE DRAWINGS

FIG. 4 is a diagram showing the definition of characters in the flowchart of FIG. 3.

FIG. 16 is a diagram for explaining the branch metric table corresponding to the trellis shown in FIG. 15.

FIG. 21 is a diagram for explaining an eighth embodiment.

DESCRIPTION OF THE PREFERRED EMBODIMENTS

Embodiments of the present invention will be explained in detail below with reference to the accompanying drawings.

[First Embodiment]

<Configuration of Viterbi Decoder>

Figure 1:
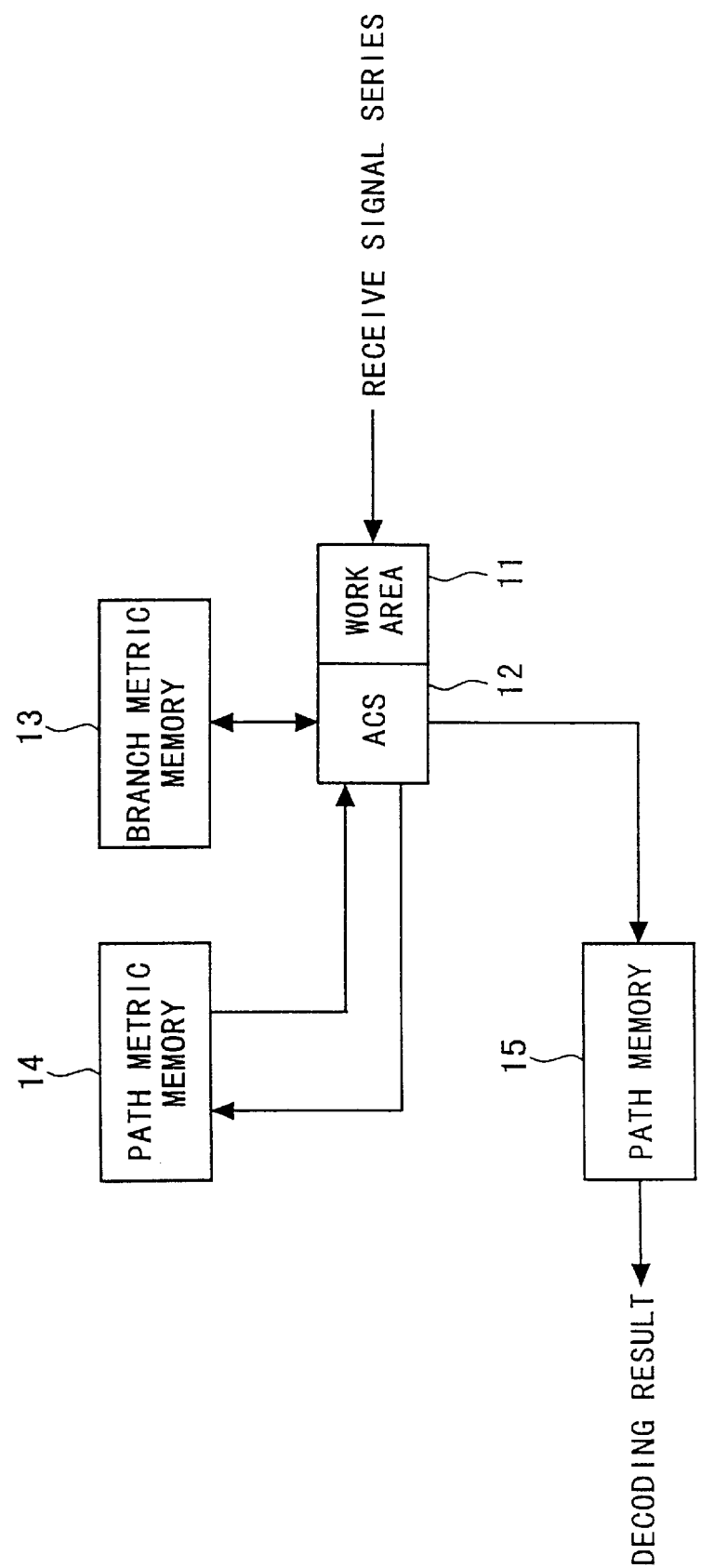
FIG. 1 is a diagram showing a configuration of a Viterbi decoder according to an embodiment of the present invention.

FIG. 1 is a diagram showing a configuration of a Viterbi decoder according to embodiments (first to eighth embodiments) of the present invention. This Viterbi decoder decodes the receive signal series input thereto by use of the Viterbi decoding scheme, and estimates and outputs the most likely information series considered to have been transmitted from the transmitting end not shown thereby to remove the code error in the transmission path between the transmitting and receiving ends.

In FIG. 1, the Viterbi decoder comprises a work area 11, an ACS (add compare select) circuit 12 (corresponding to a control unit), a branch metric memory 13 (corresponding to a storage unit), a path metric memory 14 and a path memory 15.

The work area 11 includes a RAM and is used as a work area for the Viterbi decoder. The work area 11 is input with a receive signal series to be decoded. The receive signal series according to this embodiment is a two-bit code (any one of "00", "01", "10", "11") corresponding to the time t encoded by the error correcting code.

The ACS circuit 12 performs the process for selecting a surviving path (FIG. 3) using the receive signal series input to the work area 11.

The branch metric memory 13 holds a branch metric table 16 used for calculating the branch metrics by the ACS circuit 12.

Figure 2:
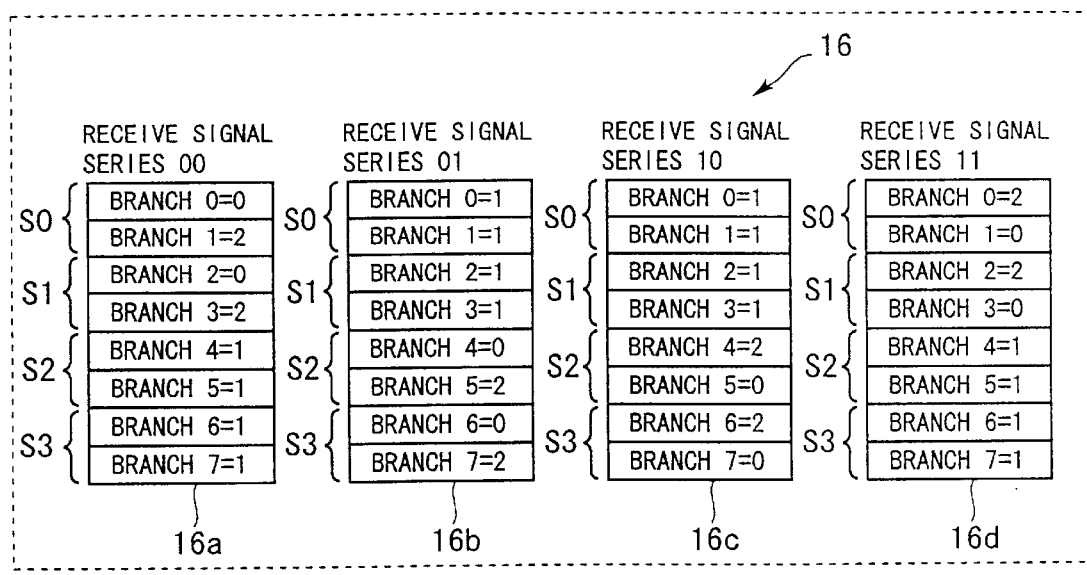
FIG. 2 is a diagram for explaining a branch metric table held in the branch metric memory shown in FIG. 1.

FIG. 2 is a diagram for explaining an example of the branch metric table 16 held in the branch metric memory 13 shown in FIG. 1. In FIG. 2, the branch metric table 16 includes tables 16a to 16d prepared in accordance with the pattern of the receive signal series input to the work area 11.

Each of the tables 16a to 16d has stored therein the branch metrics corresponding to the two branches entering each status Sk (k=0, 1, 2, 3, . . . ). The branch metrics are held by being sequentially arranged in the order of status S0, status S1, status S2 and status S3. Specifically, each branch metric corresponding to each of the status S0 to S3 is stored in the address following the address corresponding to the immediately preceding status. By the way, the value of each branch metric is set in accordance with the trellis shown in FIG. 22.

The path metric memory 14 holds the path metrics for each past status (one unit time before) in which the two branches entering the current status are connected.

The Viterbi decoder shown in FIG. 1 is actually realized by a combination of a DSP (data signal processor), a storage unit such as a semiconductor memory and software for executing the Viterbi decoding scheme.

<Processing by Viterbi Decoder>

Figure 3:
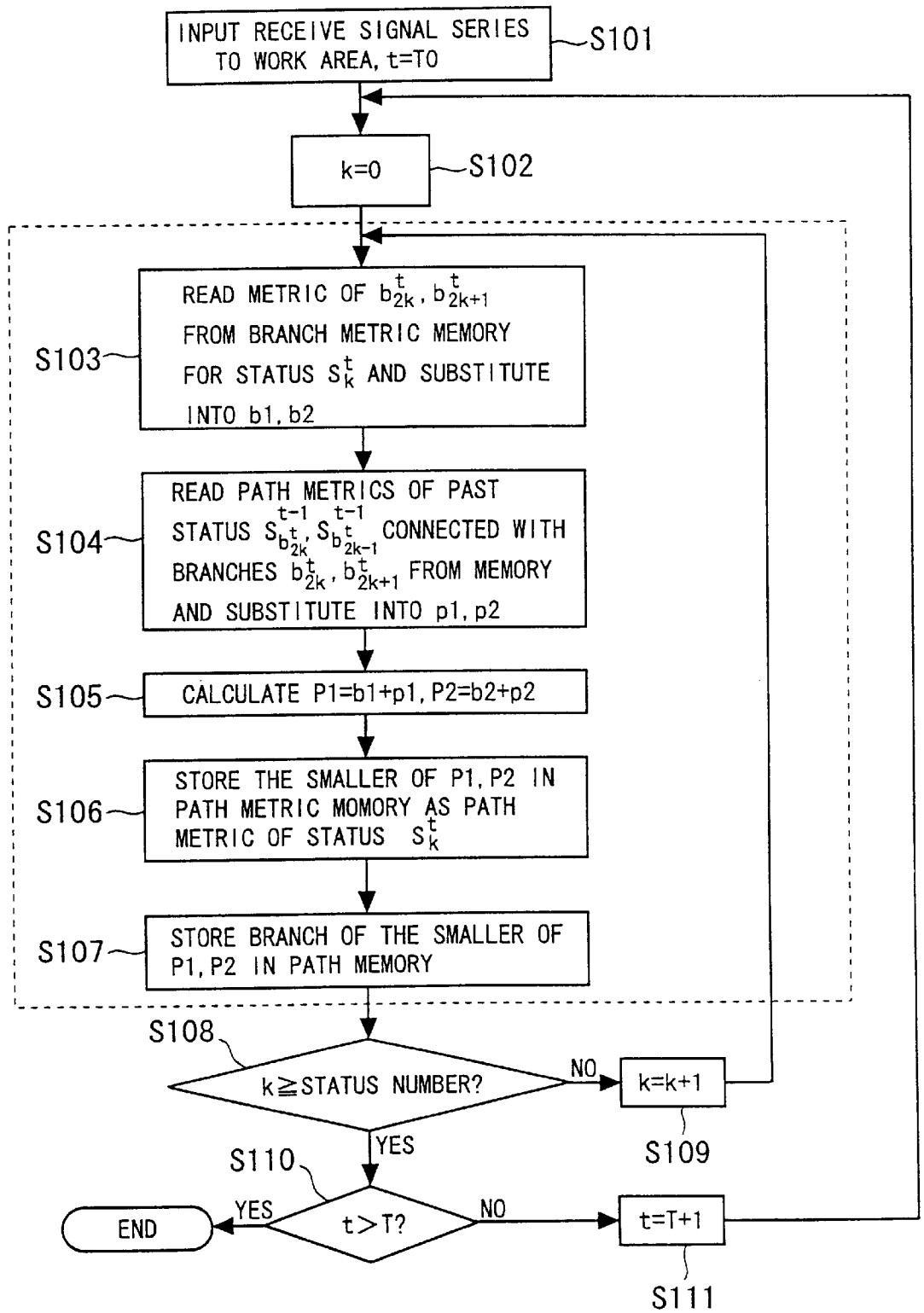
FIG. 3 is a flowchart showing the process executed by a Viterbi decoder according to the first embodiment.

FIG. 3 is a flowchart showing the processing by the Viterbi decoder according to a first embodiment. The characters in FIG. 3 have definitions shown in FIG. 4. In FIG. 3, the steps surrounded by dashed line indicate the surviving path select processing in the ACS circuit 12.

The process shown in FIG. 3 is started when the receive signal series is input to the work area 11. The work area 11 is input successively with the receive signal series corresponding to the time t. Once the receive signal series is input to the work area 11, the receive signal series first input is specified, and the time t held in the work area 11 is set to T0 (S101). Then, the status Sk held in the work area 11 is set to k=0 (S102).

With respect to the status $S^t_k$ for the specified receive signal series, the ACS circuit 12 reads the branch metrics corresponding to the branches $b^t_{2k}$, $b^t_{2k+1}$ (two branches entering the current status $S^t_k$) from the branch metric 13, and substitutes it into each algebraic values b1, b2 held in the work area 11 (S103).

Specifically, the ACS circuit 12 selects the table corresponding to the specified receive signal series from the tables 16a to 16d shown in FIG. 2, and sets a read pointer not shown to the position corresponding to the current status $S^t_k$ in the selected table.

In the first step S103 after starting the process, for example, the status Sk is k=0, i.e. the status S0. Under this condition, if the receive signal series for t=T0 is "00", for example, the ACS circuit 12 sets the read pointer to the read position (first (head) address) of the branch metric of each branch corresponding to the status S0 of the table 16a, reads each branch metric (branch 0=0, branch 1=2), and substitutes these figures into each algebraic values b1, b2 held in the work area 11.

Then, the ACS circuit 12 reads from the path metric memory 14 the path metric under each past status (status one unit time before) in which the branches $b^t_{2k}$, $b^t_{2k+1}$ are connected, using the branch output values of the respective branches $b^t_{2k}$, $b^t_{2k+1}$. The ACS circuit 12 substitutes the path metrics thus read into the algebraic values p1, p2, respectively, held in the work area 11 (S104).

Then, the ACS circuit 12 calculates P1=b1+p1, P2=b2+p2 using the algebraic values b1, b2, p1, p2 held in the work area 11. The result of the calculation is stored in the work area 11 (S105).

The ACS circuit 12 stores the smaller one of P1 and P2 held in the work area 11 in the path metric memory 14 as a path metric of the status $S^t_k$ (S106).

Then, the ACS circuit 12 stores the branch corresponding to the smaller one of P1 and P2 in the path memory 15 (S07). In this way, the surviving path selected by the ACS circuit 12 is stored in the path memory 15.

Then, it is determined whether the value k indicating the current status is greater than or equal to a predetermined status number (=3) (k≧status number) (S108). In the case where the value k is less than the status number (S108; N), 1 is added to k (S109). The process then returns to S103 for executing the processing of steps S103 to S107 (calculation of the path metric) for the next status.

At the same time, in step S103, the ACS circuit 12 moves the read pointer to the address following the address accessed in step S103. In the case where the read pointer is set to status S0 in the preceding step S103, for example, the read pointer is set to the status S1, the next address, and each branch metric in status S1 is read.

In this way, in the process of S103 in the second and subsequent rounds for a given receive signal series, the ACS circuit 12 moves (increments by 1) the read pointer to the next address. As a result, each branch metric corresponding to the receive signal series is sequentially read from any one of the tables 16a to 16d in the order of status S1, status S2 and status S3. Thus, in the process of S103 in the second and subsequent rounds for a given receive signal series, the address generation is not required. For this reason, the time required for calculating each branch metric for each status $S^t_k$ is shortened.

In S108, on the other hand, assume that the value k is determined to be greater than or equal to the status number (S108; Y). It is determined whether the time t exceeds the time T or not (S110). In the case where the time t exceeds the time T (S110; Y), the process for all the receive signal series input to the work area 11 is regarded to have been terminated, so that the process shown in FIG. 3 ends.

In the case where the time t is not greater than T (S110; N) in S110, on the other hand, the time t is set to the sum of the current time t and 1. In the case where the current time t is T0, for example, the time t is set to T1. After that, the process returns to S102 to execute steps S102 to S111 for the next receive signal series.

Upon completion of the process of FIG. 3 for all the receive signal series in this way, the information on the surviving path corresponding to each receive signal series is held in the path memory 15. After that, as in the prior art, the back trace processing is executed using the information on the surviving path held in the path memory 15, so that the code series estimated to have been transmitted from the transmitting end is output from the path memory 15.

<Operation of First Embodiment>

In the Viterbi decoder according to the first embodiment, the branch metric table 16 used for calculating the branch metric includes the tables 16a to 16d prepared in accordance with the pattern of the receive signal series, and each of the tables 16a to 16d sequentially holds the branch metrics corresponding to each status Sk.

For this reason, in determining each branch metric corresponding to the status $S^t_{k+1}$ following a given status $S^t_k$ at a given time t, the position of the read pointer is incremented by 1 (sequential access) thereby to produce the related branch metric.

Thus, as compared with the conventional Viterbi decoder (prior art) in which the branch metric is read from the table by random access, the time required for calculating the branch metric can be shortened.

The calculation of the branch metric involves a large amount of calculations. Thus, the shorter the time required for calculation of one branch metric (one process of S103), the shorter the time required for decoding the receive signal series. With the Viterbi decoder according to the first embodiment, therefore, as compared with the conventional Viterbi decoder (prior art), the decoding rate of the receive signal series can be improved.

Also, as compared with the prior art, the amount of the branch metrics held in the branch metric table 16 can be reduced. Therefore, the storage capacity of the branch metric memory 13 holding the branch metric table 16 can be reduced in size as compared with the prior art.

[Second Embodiment]

Now, a Viterbi decoder according to a second embodiment of the invention will be explained. The second embodiment and the first embodiment have common points, and therefore only the difference from the first embodiment will be explained.

The output values of the two branches entering each status Sk (k=0, 1, 2, . . . ) constituting a trellis is normally set in such a manner that the branch metric (humming distance) between them is maximum in order to maximize the error correction capability. In the trellis shown in FIG. 21, for example, the branch output value of the branch 0 is "00", whereas the branch output value of the branch 1 is "11". In this way, the bits of the output value of one branch are inverted from the bits of the other branch output value.

In view of this fact, taking into account that the output value is two bits regardless of the receive signal series, the branch metric of the branch $b^t_{2k+1}$ with respect to the branch $b^t_{2k}$ can be determined as Branch metric of branch 1=2–branch metric of branch This equation can be generalized as Branch metric of branch $b^t_{2k+1}$=Const (constant: $C$)–branch metric of branch $b^t_{2k}$ ($k$=0, 1, 2 . . . ).

Using this characteristic, the branch metric of only one of two branches entering a given status Sk (k=0, 1, 2, . . . ) can be stored in the branch metric table.

Figure 5:
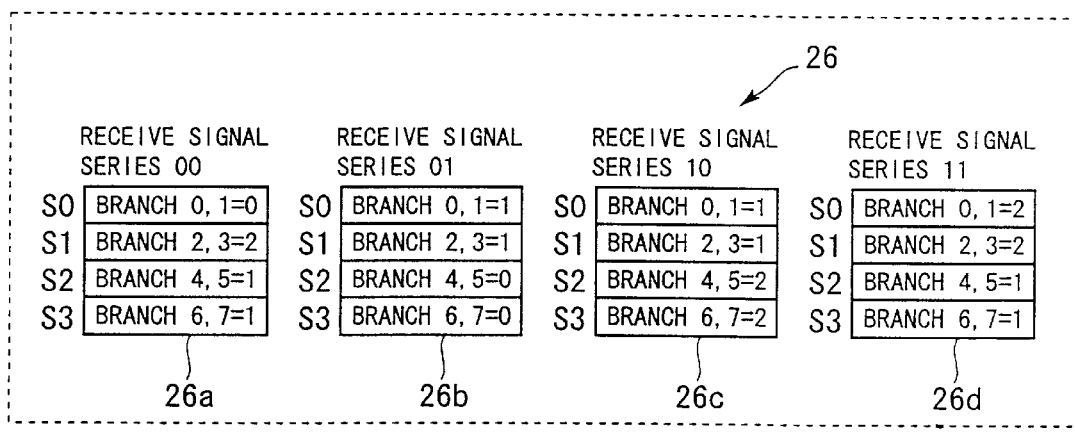
FIG. 5 is a diagram for explaining an example of the branch metric table according to a second embodiment.

FIG. 5 is a diagram for explaining an example of the branch metric table 26 according to a second embodiment. In FIG. 5, the branch metric table 26 includes tables 26a to 26d prepared in accordance with the pattern of the receive signal series (2-bit code). Each of the tables 26a to 26d holds only the branch metric of one of the branches in each status Sk.

In this example, each of the tables 26a to 26d holds only the branch metric corresponding to the branch (branch $b^t_{2k}$) smaller in branch number for each status $S^t_k$. The table 26a, for example, holds only the branch metric of the branch 0 as a branch metric of each branch corresponding to status S0.

The tables 26a to 26d, like in the first embodiment (tables 16a to 16d) hold the branch metrics corresponding to each status Sk sequentially (status S0, status S1, status S2, status S3 in that order).

The Viterbi decoder according to the second embodiment has a similar configuration to that of the first embodiment (FIG. 1) with the exception that the branch metric memory 13 holds the branch metric table 26 shown in FIG. 5 instead of the branch metric table 16 (FIG. 2).

Figure 6:
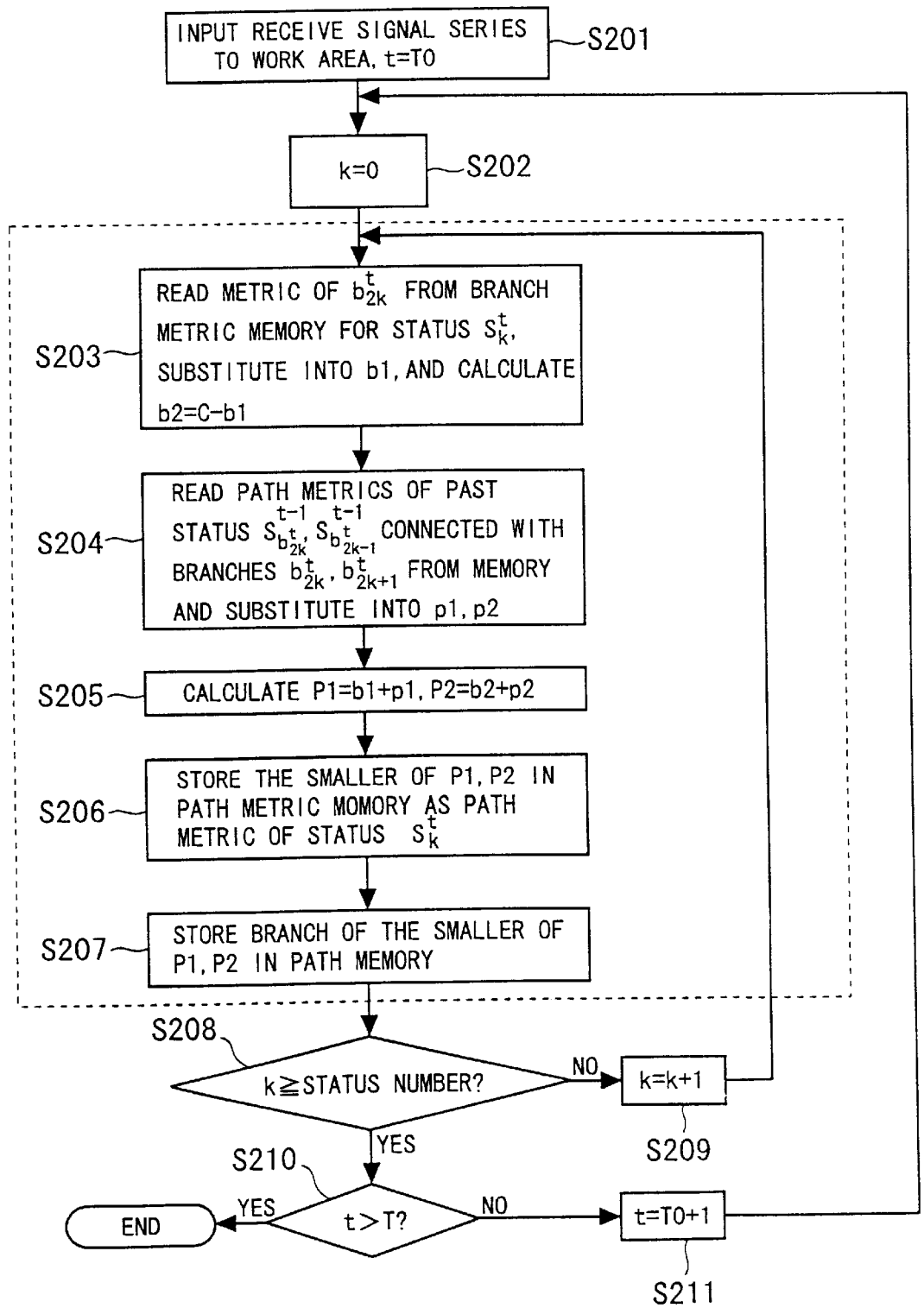
FIG. 6 is a flowchart showing the process executed by a Viterbi decoder according to the second embodiment.

FIG. 6 is a flowchart showing the process executed by the Viterbi decoder according to the second embodiment. As shown in FIG. 6, the Viterbi decoder according to the second embodiment executes substantially the same processing as in the first embodiment except for step S203 (FIG. 3). Therefore, only the process of S203 will be explained and the other steps will not be described.

In step S203, the ACS circuit 12 reads the branch metric of the branch $b^t_{2k}$ from the branch metric memory 13 for the status $S^t_k$, substitutes it into the algebraic value b1 and calculates $b^t_{2k+1}$ (b2)=C (constant)–b1 for the branch $b^t_{2k+1}$ (b2).

Specifically, the ACS circuit 12 selects the table corresponding to the receive signal series associated with the object to be processed, from the tables 26a to 26d shown in FIG. 5. Then, the ACS circuit 12 reads the branch metric corresponding to the branch for the current status $S^t_k$ from the selected table.

In the process, the ACS circuit 12 reads the branch metric smaller in branch number ($b^t_{2k}$) from one of the tables 26a to 26, and substitutes it in the algebraic value held in the work area 11. Then, the ACS circuit 12 calculates b2=C–b1 using the algebraic value b1 so that the branch metric corresponding to the other branch $b^t_{2k+1}$ entering the status $S^t_k$ is calculated as an algebraic value b2.

After that, in the case where step S203 is executed again and the branch metric is read from the branch metric table 26, the ACS circuit 12 increments by one the position of the read pointer as in the first embodiment, and thereby reads the branch metric corresponding to the branch entering the next status. In this way, the branch metric table 26 is sequentially accessed, and therefore, as in the first embodiment, the time required for calculation of the branch metric can be shortened.

The Viterbi decoder according to the second embodiment exhibits substantially the same effect as that of the first embodiment. Further, with the Viterbi decoder according to the second embodiment, as compared with that of the first embodiment, the amount of the branch metrics held in the branch metric table can be reduced to one half. As a result, the storage capacity of the branch metric memory 13 can be reduced as compared with the first embodiment.

[Third Embodiment]

Now, the Viterbi decoder according to the third embodiment will be explained. The third embodiment shares some point with the first and second embodiments. Therefore, only the difference from the first and second embodiments will be explained.

According to the second embodiment, in the calculation of the branch metric of each branch, the branch metric of the branch $b^t_{2k+1}$ is determined using equation (C (constant)– (branch metric of branch $b^t_{2k}$)). In this equation, the constant C varies with the puncture rate. Therefore, the determination of the path metric for a given status S0 requires the following calculation.

(1) Path metric candidate for status S0=branch metric of branch 0+path metric one unit time before branch 0

(2) C=Constant const (dependent on puncture rate)

(3) Metric of branch 1=C–metric of branch 0

(4) Path metric candidate for status S0=branch metric for branch 1+path metric one unit time before branch 1

(5) Path metric for status S0=min[(1), (4)]

In this case, the branch metric between the receive signal series and the branch output value is not directly stored in the branch metric memory, but using the following conversion formula, a branch metric can be converted to another branch metric, thereby making it possible to reduce the calculation amount of the branch metric.

x: branch metric of branch N (N: even number)

y: branch metric of branch N+1 a=(x–y)×C (C=constant) . . . [conversion formula]

After conversion of branch N, the branch matrix x' is given as x'=a (x>y)

x'=–a (x<y)

x'=0 (x=y)

Also, the metric of branch N+1 is $$y'=-x'$$

Take the branch metric table 26 of FIG. 5 as an example. In the table 26a corresponding to the receive signal series "00", the branch metric of the branch 0 is "0", and the branch metric of the branch 1 is "2". Using the conversion formula described above, the branch metric of branch 0 becomes –1, and the branch metric of branch 1 becomes 1 (assuming that C=½), so that the values of the branch metrics can be symmetric about zero.

Figure 7:
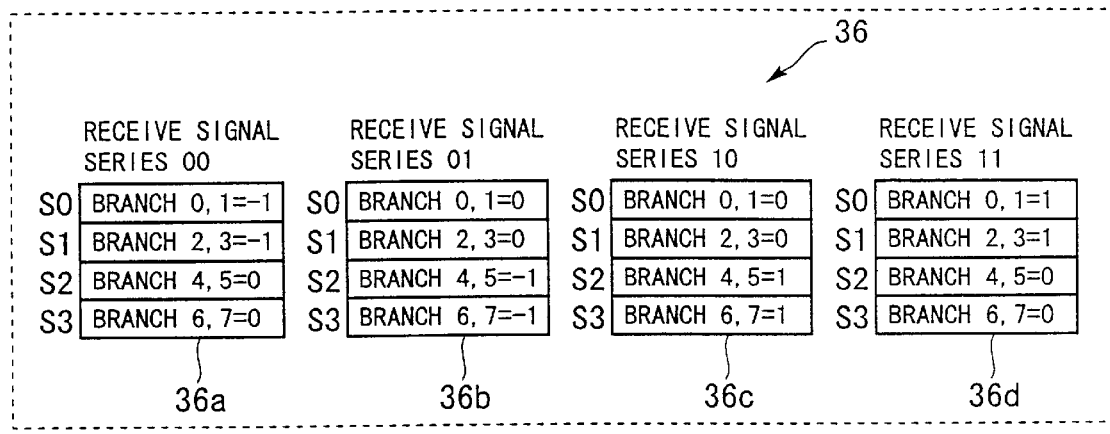
FIG. 7 is a diagram for explaining an example of the branch metric table according to a third embodiment.

FIG. 7 is a diagram for explaining an example of the branch metric table 36 according to a third embodiment. As shown in FIG. 7, the tables 36a to 36d constituting the branch metric table 36 holds the branch metrics converted by the aforementioned conversion formula from the branch metrics held in the tables 26a to 26d shown in FIG. 5.

Also, the tables 36a to 36d, like the tables 26a to 26d, hold the branch metrics corresponding to the status $S^t_k$ sequentially (in the order of status S0, status S1, status S2 and status S3).

The Viterbi decoder according to the third embodiment has a similar configuration to the first embodiment (FIG. 1).

The only difference is that the branch metric memory 13 holds the branch metric table 36 of FIG. 7 instead of the branch metric table 16 (FIG. 2).

Figure 8:
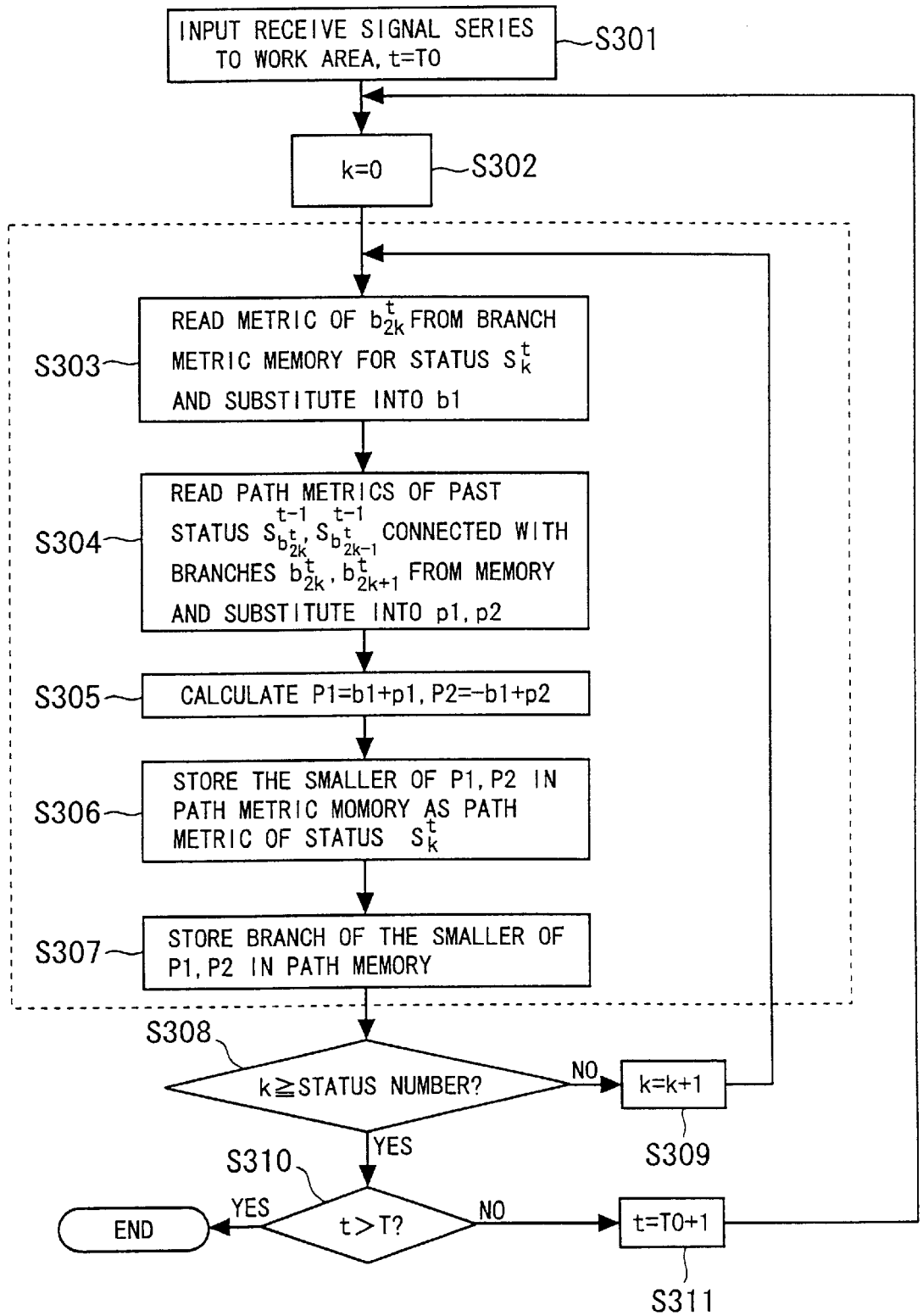
FIG. 8 is a flowchart showing the process executed by the Viterbi decoder according to the third embodiment.

FIG. 8 is a flowchart showing the process executed by the Viterbi decoder according to the third embodiment. As shown in FIG. 8, the Viterbi decoder according to the third embodiment executes the substantially same processing as in the first embodiment (FIG. 3) except for steps S303 and 3305. Therefore, the process of only steps S303 and S305 will be described and other steps will not.

In S303, the ACS circuit 12 reads the branch metric of the branch $b'_{2k}$ from the branch metric memory 13 for the status $S'_k$ and substitutes it into the algebraic value b1.

After that, the ACS circuit 12 calculates P1=b1+p1, P2=-b1+p2 using p1, p2 obtained in step S304. Specifically, the branch metric of the branch $b'_{2k+1}$ (b2) is preset so that b1 and b2 are symmetric, and therefore P2 can be determined using -b1 instead of b2.

In the Viterbi decoder according to the third embodiment, like the one in the first embodiment, the branch metric table 36 can be sequentially accessed. As a result, the processing speed of the ACS circuit 12 can be improved over the prior art. Also, in the third embodiment, like the second embodiment, the storage capacity of the branch metric memory 13 can be reduced as compared with the first embodiment.

Further, according to the third embodiment, as described above, the surviving path select processing for all the status with respect to the receive signal series and the surviving path select processing for the status S0 with respect to the receive signal series "00", for example, can be performed only by the calculations shown below in the processing shown in FIG. 8.

(1) Path metric candidate for status S0=branch metric of branch 0 (=-1)+path metric one unit time before branch 0 (S305)

(2) Path metric candidate for status S0=metric of branch 1 (=1)+path metric one unit time before branch 1 (S305)

(3) Path metric for status S0=min[(1), (2)] (S306, S307)

As described above, according to the third embodiment, the calculation of b2 is not required, and therefore, as compared with the first and second embodiments, the surviving path select processing by the ACS circuit 12 can be shortened. Especially, the calculation of the branch metric involves the most repetitions in the Viterbi decoder, and therefore the Viterbi decoder according to the third embodiment can reduce the operation amount considerably and shorten the decode processing of the receive signal series.

[Fourth Embodiment]

Now, the Viterbi decoder according to a fourth embodiment of the invention will be explained. The fourth embodiment has some points shared by the first and third embodiments, and therefore only the different points with the first and third embodiments will be explained.

The tables 36a to 36d shown in FIG. 7 always hold the branches having the same branch metric. In view of this, when these are grouped, the branch metrics can be read by sequential access by the ACS circuit 12 for those grouped branches that are arranged sequentially. Thus, a common memory can be used.

Figure 9:
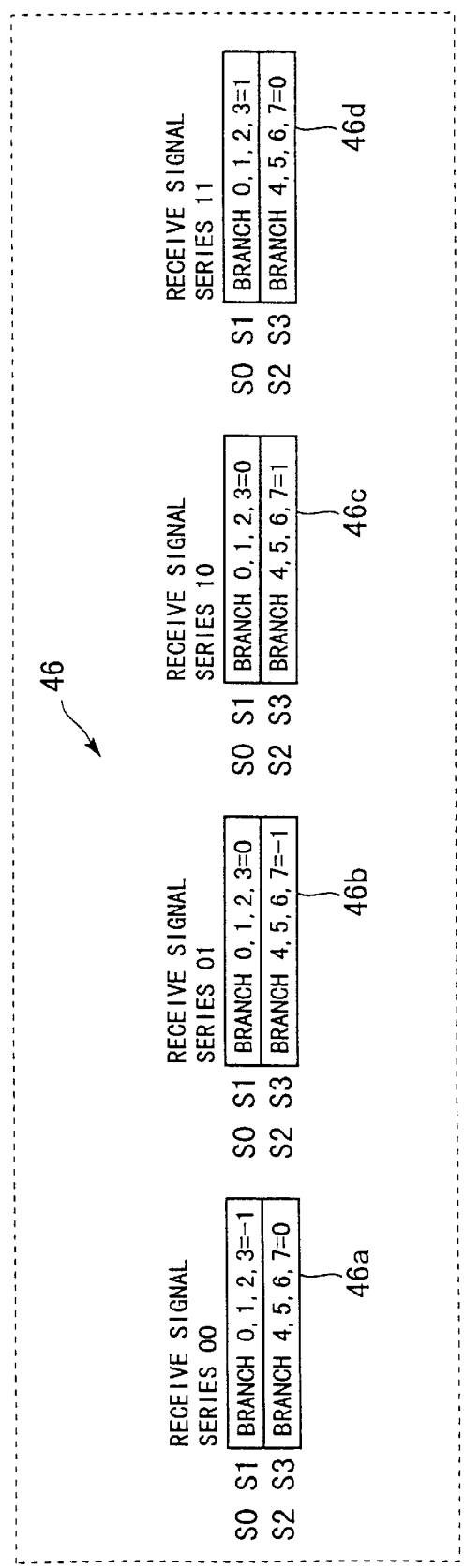
FIG. 9 is a diagram for explaining an example of the branch metric table according to a fourth embodiment.

FIG. 9 is a diagram for explaining an example of the branch metric table 46 according to the fourth embodiment. As shown in FIG. 9, the tables 46a to 46d constituting the branch metric table 46 are the branch metrics held in the tables 36a to 36d of FIG. 7 and grouped by the above-mentioned technique.

For example, the branches 0, 1, 2, 3 having the same branch metric (=-1) are held in the first address of the table 46a in a manner corresponding to status S0 and status S1. In the address following the first address, on the other hand, the branches 4, 5, 6, 7 having the same branch metric (=0) are held in a manner corresponding to status S2 and status S3.

The Viterbi decoder according to the fourth embodiment has a similar configuration to the first embodiment (FIG. 1). However, the branch metric memory 13, instead of the branch metric table 16 (FIG. 2), holds the branch metric table 46 shown in FIG. 9.

Figure 10:
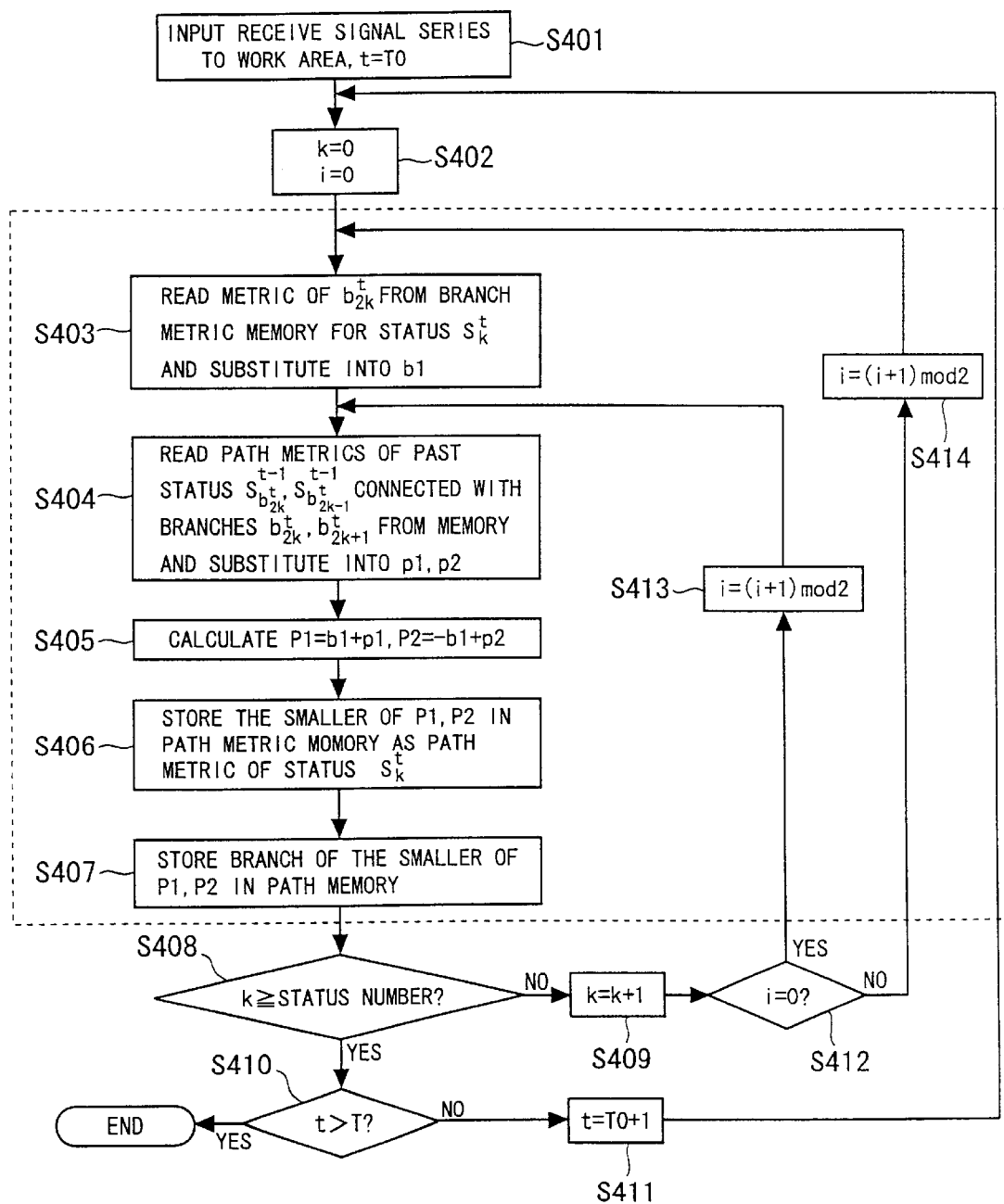
FIG. 10 is a flowchart showing the process executed by a Viterbi decoder according to the fourth embodiment.

FIG. 10 is a flowchart showing the processing by the Viterbi decoder according to the fourth embodiment. As shown in FIG. 10, the Viterbi decoder according to the fourth embodiment performs substantially the same processing as the third embodiment except for the process of S402, S412 to S414 (FIG. 8). Therefore, only the processes of S402, S412 to S424 will be explained but the other processes will not be explained.

In S402, the value k indicating the status is set to 0, while the flag i held in the work area 11 is set to 0. After that, the process proceeds to step S412 through S403 to S409. In S412, it is determined whether the flag i is zero or not. In the case where the flag i is zero (S412; Y), the process proceeds to step S413, while in the case where the flag i is not zero (S412; N), the process proceeds to step S414.

In S413, the ACS circuit 12 performs the processing of i=(i+1)mod2 and the flag i is set to 1. After that, the process returns to step S404. In this way, when the process proceeds from S413 to S404, the ACS circuit 12 performs the processing of S404 using the value b1 of the branch metric read in step S403. As a result, the processing (S403) for reading the branch metric from the branch metric table 36 with status transition is omitted.

In the case where the process proceeds to step S413 and the ACS circuit determines that i is not zero, in contrast, the ACS circuit 12 performs the processing of i=(i+1)mod2 and sets the flag i to zero. After that, the process returns to S403 for accessing the branch metrics sequentially.

As described above, when the flag i is zero in step S412, the access to the branch metric table 46 is omitted, while when i is 1, the branch metric table 46 is sequentially accessed.

In the process shown in FIG. 10, when the status is S1 or S2, the process proceeds from S412 through S413 to S404, while when the status is S2, the process proceeds from S412 through S414 to S403. As a result, in the process for surviving path selection for the status S0 to S3 at a given time t, the branch metric table 46 is accessed twice, and the second access is made to the address following the address of the first access.

In the Viterbi decoder according to the fourth embodiment, the effects of the first and third embodiments are exhibited. Further, according to the fourth embodiment, the branch metric memory 13 can be accessed less often, and therefore the processing speed of the ACS circuit 12 can be improved as compared with the first and third embodiments, thereby improving the speed of the decode processing.

[Fifth Embodiment]

Now, the Viterbi decoder according to a fifth embodiment of the invention will be explained. The fifth embodiment has some points shared also by the first and fourth embodiments. Therefore, only the different points from the first and fourth embodiments will be explained.

Figure 11:
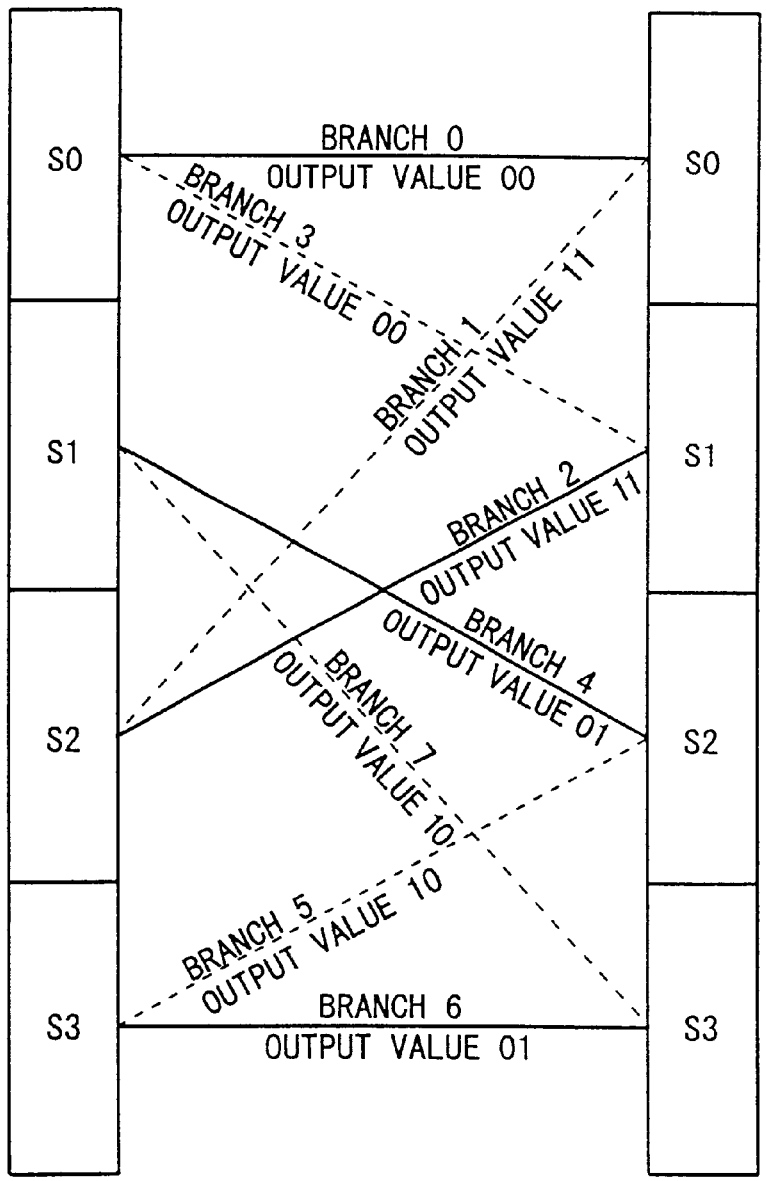
FIG. 11 is a diagram showing a trellis applied to a fifth embodiment.
Figure 12:
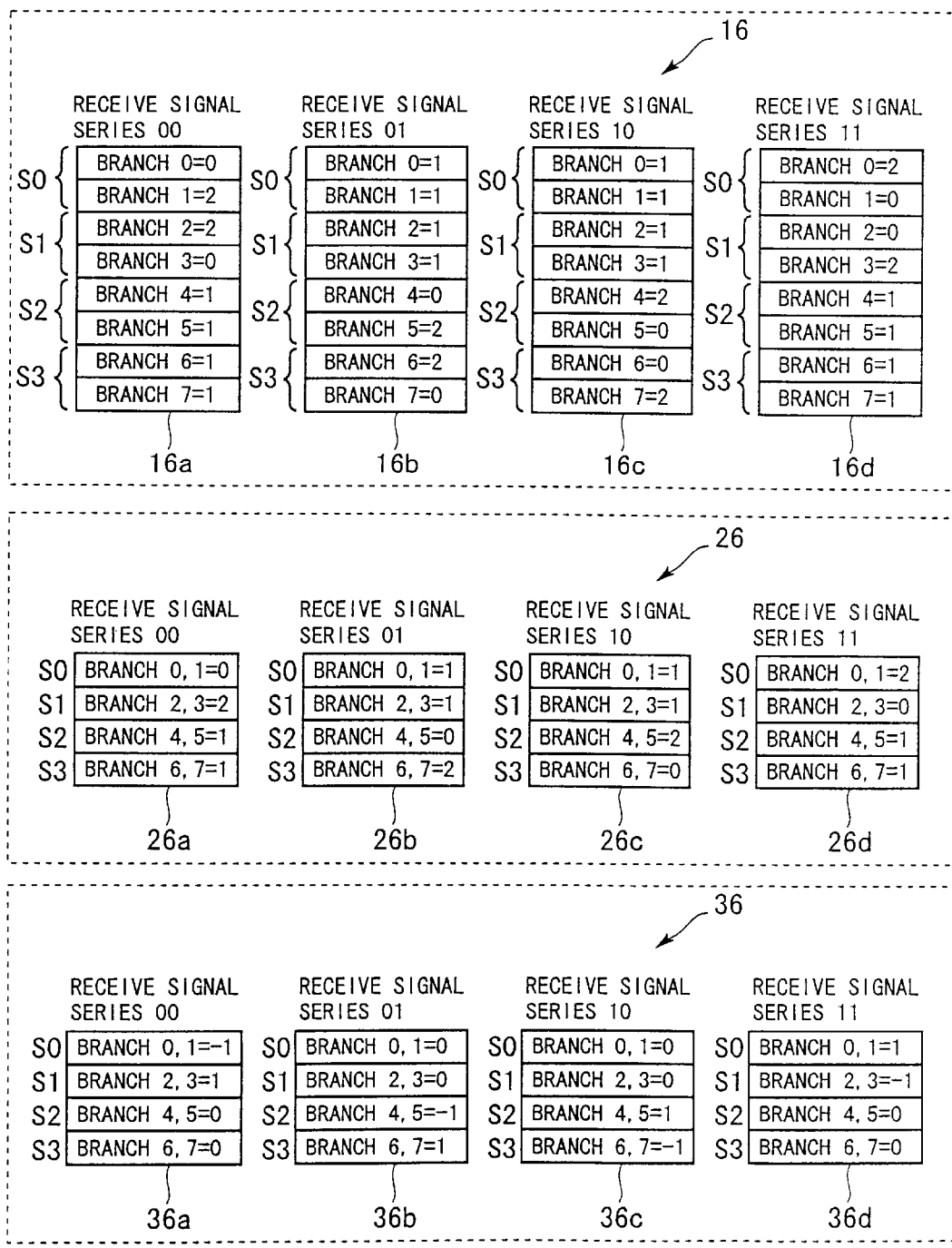
FIG. 12 is a diagram for explaining the branch metric table corresponding to the trellis shown in FIG. 11.

In the case where the trellis shown in FIG. 11 is used for the Viterbi decoder, the branch metric tables 16, 26, 36 for the first, second and third embodiments are changed as shown in FIGS. 12(a), (b) and (c), respectively.

In FIGS. 12(a), (b), (c), the branches 4, 5, 6, 7 in the table 36a shown in FIG. 12(c), for example, have the same branch metric value of zero, and therefore can be combined into one group. The branches 0, 1, 2, 3 in the table 36a, in contrast, cannot be combined since the values of branches 0, 1 and the values of the branches 2, 3 are symmetric about zero (opposite in positive and negative signs).

Figure 13:
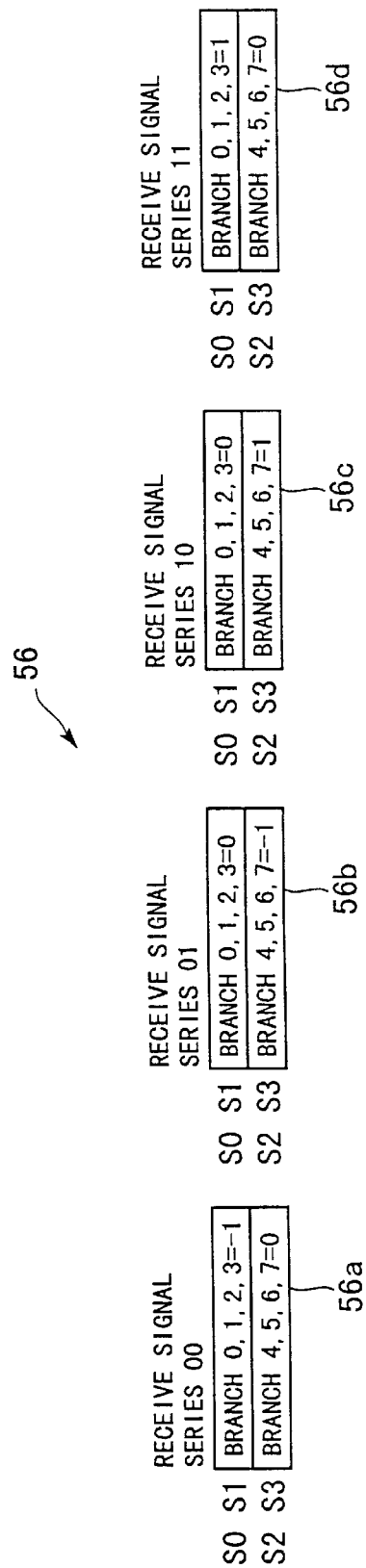
FIG. 13 is a diagram for explaining an example of the branch metric table according to a fifth embodiment.

By combining the branches 0, 1, 2, 3 of the table 36a are combined into a single category represented by the values of the branches 0, 1, and the branch metric table 36 shown in FIG. 12(c) is configured like the branch metric table 56 shown in FIG. 13, however, the ACS circuit 12 can perform the following calculations, and therefore the branch metrics of the branches can be sequentially obtained.

Metric of branch 0=values of branches 0, 1, 2, 3 of branch metric memory

Metric of branch 1=−1×values of branches 0, 1, 2, 3 of branch metric memory

Metric of branch 2=values of branches 0, 1, 2, 3 of branch metric memory

Metric of branch 3=−1×values of branches 0, 1, 2, 3 of branch metric memory

Metric of branch 4=values of branches 4, 5, 6, 7 of branch metric memory

Metric of branch 5=−1×values of branches 4, 5, 6, 7 of branch metric memory

Metric of branch 6=values of branches 4, 5, 6, 7 of branch metric memory

Metric of branch 7=−1×values of branches 4, 5, 6, 7 of branch metric memory

FIG. 13 is a diagram for explaining an example of the branch metric table 56 according to a fifth embodiment. As shown in FIG. 13, the tables 56a to 56d constituting the branch metric table 56 include the branch metrics held in the tables 36a to 36d of FIG. 12(c) grouped by the technique described above.

For example, the first address of the table 56a has stored therein the branch metrics of the branches 0, 1, 2, 3 for status S0 and status S1 grouped with the branch metric (=−1) of the branches 0, 1 as a representative. The address following the first address, on the other hand, has stored therein the branch metrics for the status S2 and status S3 combined from the branches 4, 5, 6, 7 having the same branch metric (=0).

The Viterbi decoder according to the fifth embodiment has a similar configuration to that of the first embodiment (FIG. 1). However, the branch metric table 56 shown in FIG. 13 instead of the branch metric table 16 (FIG. 2) is held in the branch metric memory 13.

Figure 14:
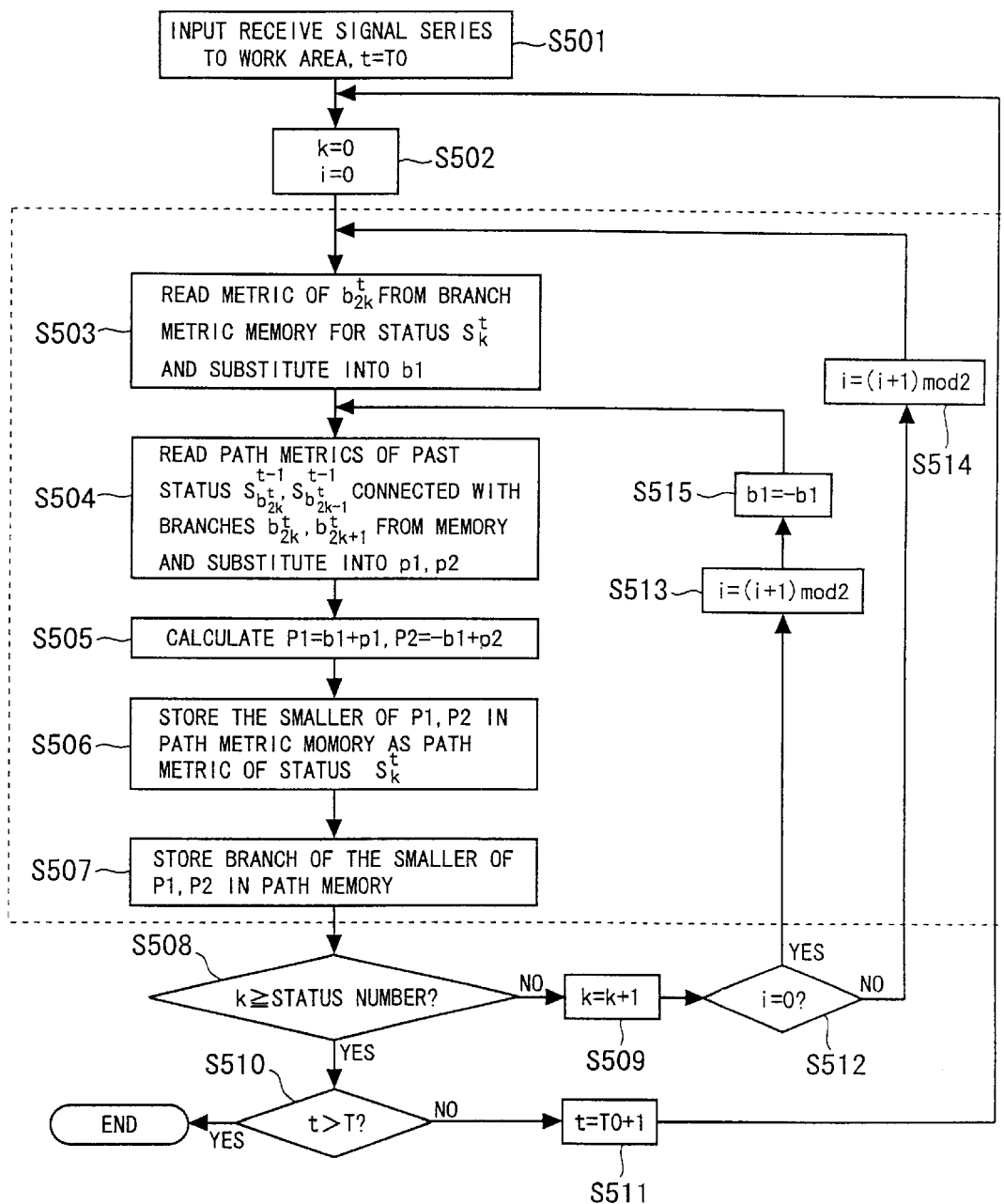
FIG. 14 is a flowchart showing the process executed by a Viterbi decoder according to the fifth embodiment.

FIG. 14 is a flowchart showing the process executed by the Viterbi decoder according to the fifth embodiment. As shown in FIG. 14, the Viterbi decoder according to the fifth embodiment performs substantially the same processing as the fourth embodiment except for the process of step S515 (FIG. 10). Therefore, only the process of step S515 will be explained but not other processes.

The process of S515 is performed after the processing of S513 in the case where the value k indicating the status is k=1 or k=3. In S515, the ACS circuit 12 sets the algebraic value b1 obtained in the preceding step S503 to −b1, and returns the process to step S504.

The Viterbi decoder according to the fifth embodiment produces substantially the same effect as the fourth embodiment.

[Sixth Embodiment]

A Viterbi decoder according to a sixth embodiment of the invention will be described. The sixth embodiment has some points shared by the first and fifth embodiments, and therefore only the difference with the first and fifth embodiments will be mainly described.

Figure 15:
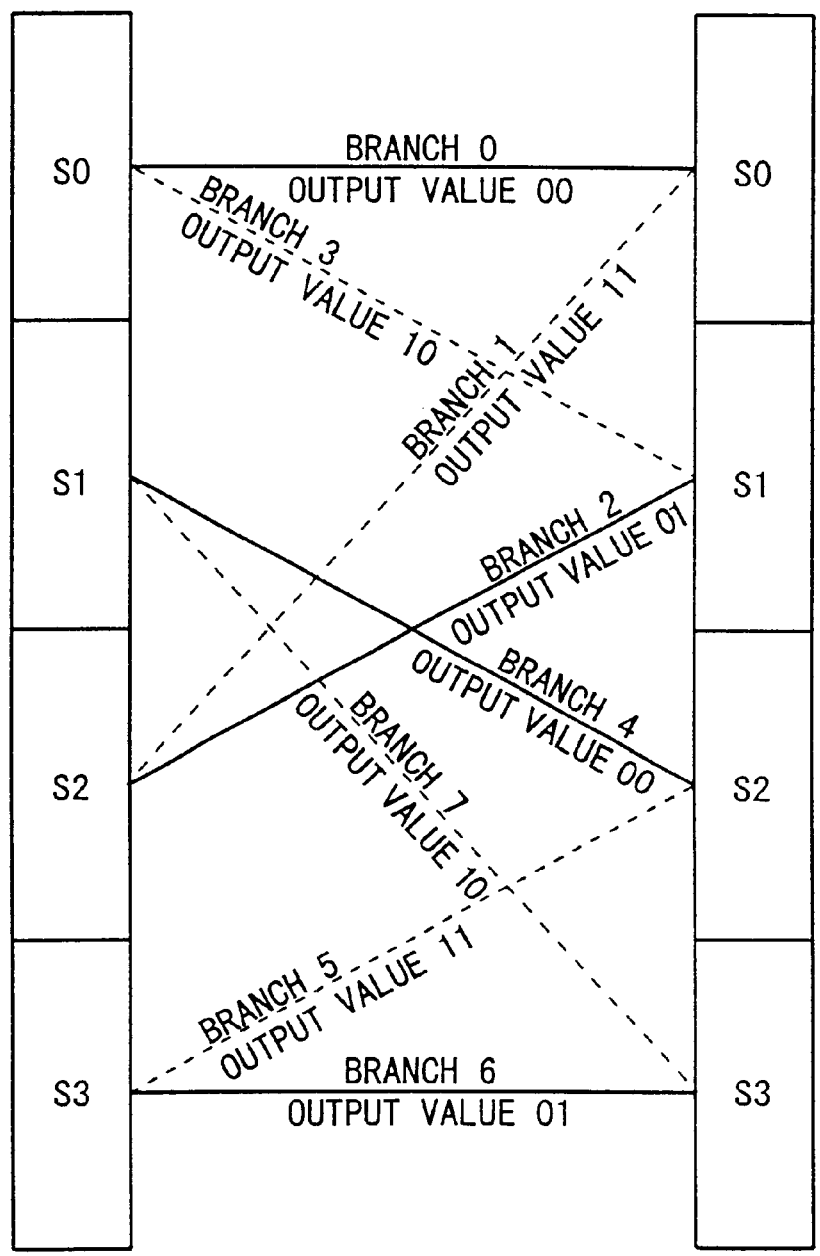
FIG. 15 is a diagram showing a trellis applied to a sixth embodiment.

Depending on the code (receive signal series) decoded by the Viterbi decoder, the trellis as shown in FIG. 15 may be involved. With respect to the trellis shown in FIG. 15, a branch metric table is produced using the technique described in the first to third embodiments. A branch metric table as shown in FIG. 16 is thus obtained.

In the branch metric table shown in FIG. 16, the values of the branch metrics of adjoining status (for example, the branch metric of 1 for status S0 and the branch metric of 0 for status S1 in the table corresponding to the receive signal series "00") are not the same, unlike the branch metric table 36 shown in FIG. 7 (in the table 36a of FIG. 7, the branch metric for status S0 and the branch metric for status S1 are both −1, for example).

Also, in the branch metric table shown in FIG. 16, unlike in the branch metric table 46 shown in FIG. 9, the branch metrics of the adjoining status have no opposite positive and negative values (values symmetric about zero having the same absolute value).

In such a case, as shown in FIG. 16, in the case where the branch metric values of the branches 0, 1 (status S0) are the same as the branch metric values of the branches 4, 5 (status S2), these are combined into a single group. In similar fashion, the branches 2, 3 (status S1) and the branches 6, 7 (status S3) having the same branch metric value are combined and held in a group. Then, the branch metric table can be reduced in size.

Figure 17:
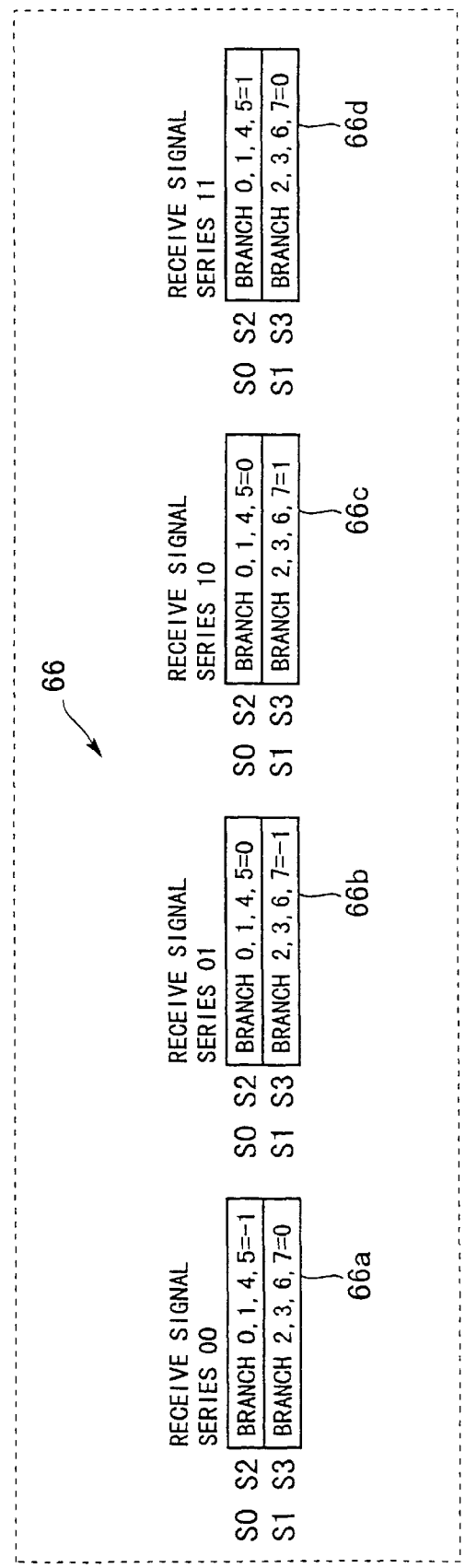
FIG. 17 is a diagram for explaining an example of the branch metric table according to the sixth embodiment.

FIG. 17 is a diagram for explaining an example of the branch metric table 66 according to the sixth embodiment. In FIG. 17, a branch metric group for the branches 0, 1, 4, 5 corresponding to the status S0 and status S2 is held in the first addresses of the tables 66a to 66d constituting the branch metric table 66. Also, a branch metric group for the branches 2, 3, 6, 7 corresponding to status S1 and S3 is held in the address immediately following the first address.

The Viterbi decoder according to the sixth embodiment has a similar configuration to the first embodiment (FIG. 1). The branch metric memory 13, however, holds the branch metric table 66 shown in FIG. 5 instead of the branch metric table 16 (FIG. 2).

The Viterbi decoder according to the sixth embodiment has the configuration described above, and therefore the ACS circuit 12 cannot read the branch metrics held in the tables 66a to 66d in the order of the branch number of the trellis.

Nevertheless, taking advantage of the fact that a plurality of branch metrics can be acquired at the same time by a single access to the branch metric table as described in the fourth embodiment, the ACS circuit 12 is so configured as to perform the simultaneous processing for a plurality of branches capable of acquiring the branch metrics with a single access. Although the work area 11 is increased unavoidably, the sequential access to the tables 66a to 66d becomes possible. Specifically, the ACS circuit 12 can access the branch metric table 66 sequentially by performing the following calculations in the following order:

(1) Reading the branch metrics of the branches 0, 1, 4, 5.
(2) Calculating the path metrics.
(3) Selecting the branch of status S0.
(4) Selecting the branch of status S2.

The Viterbi decoder according to the sixth embodiment, however, cannot access the path memory sequentially.

Figure 18:
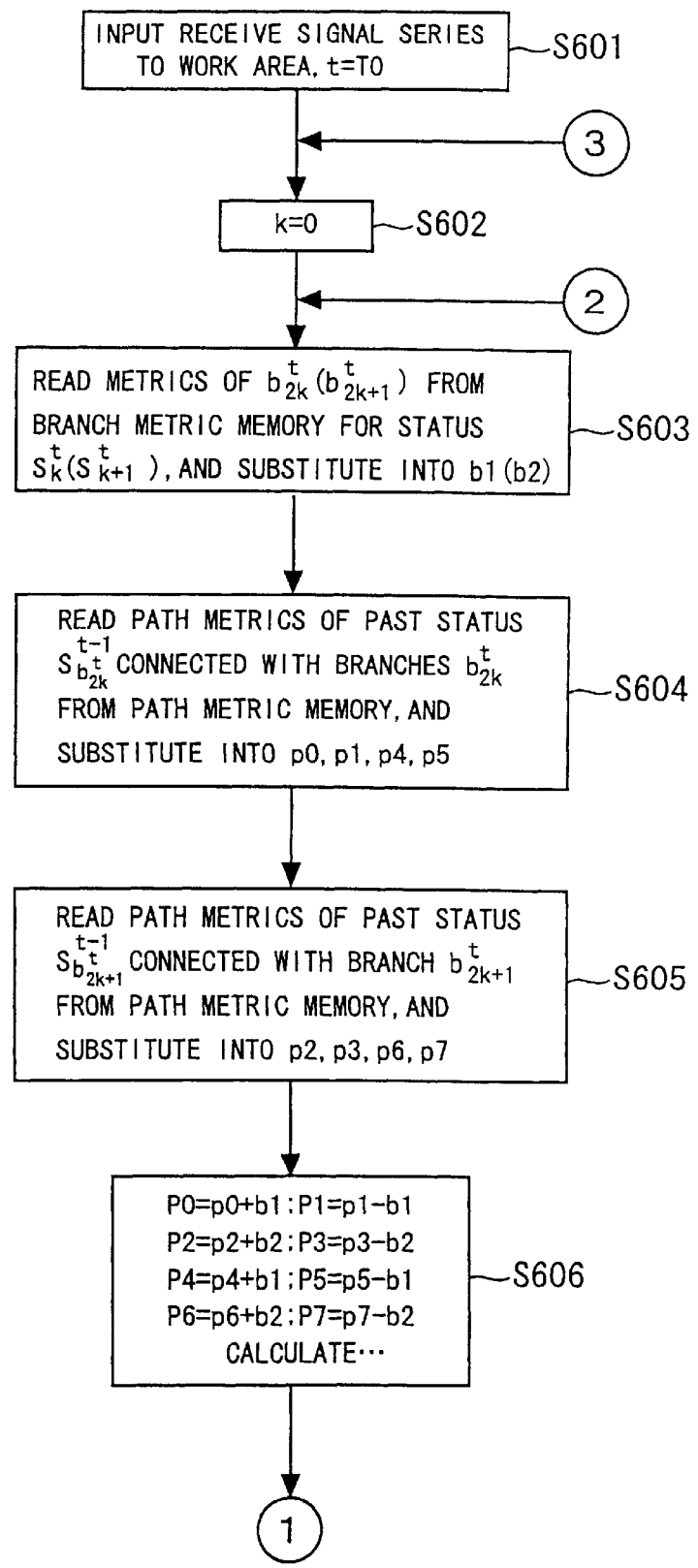
FIG. 18 is a flowchart showing the process executed by a Viterbi decoder according to the sixth embodiment.
Figure 19:
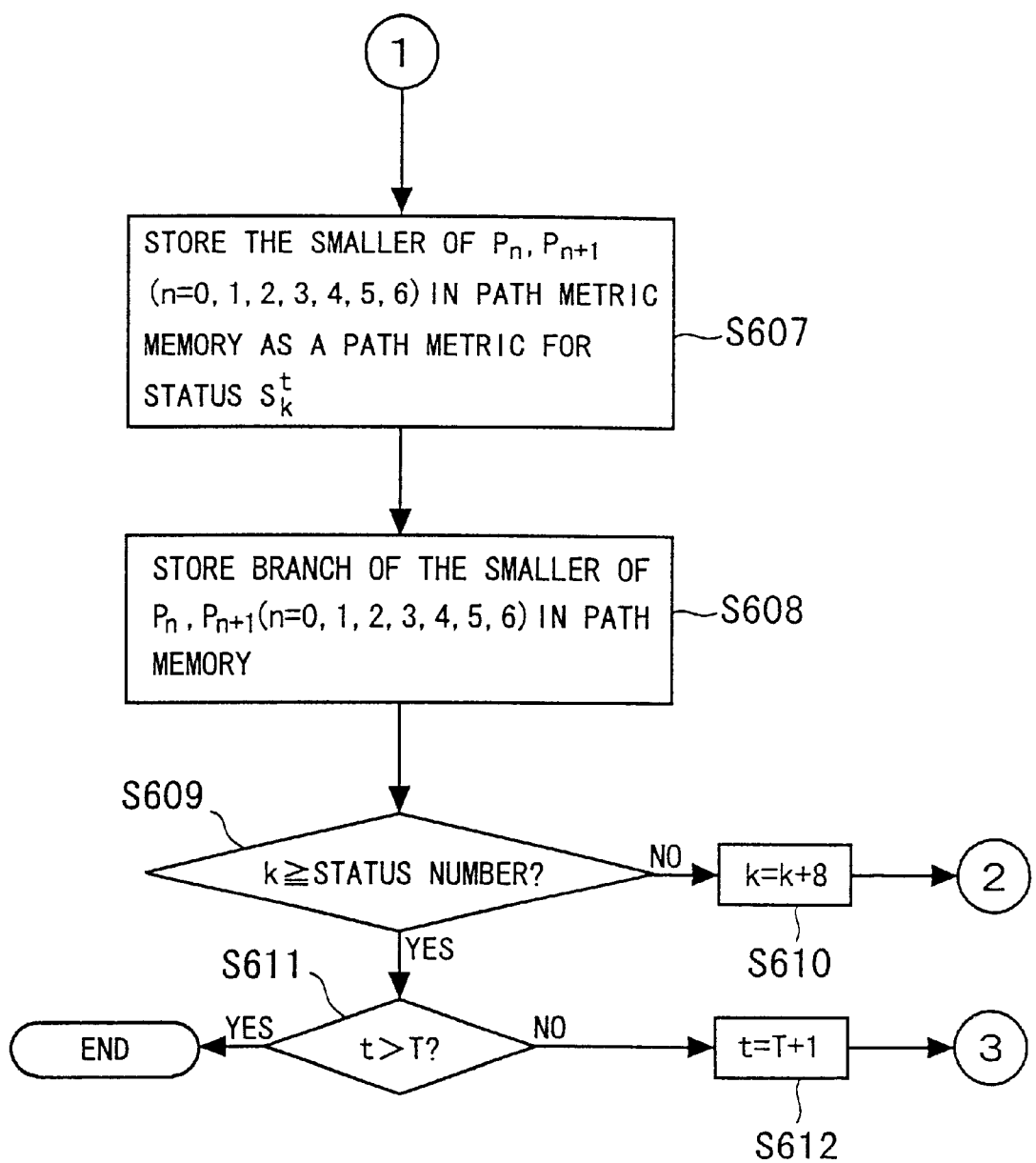
FIG. 19 is a flowchart showing the process executed by a Viterbi decoder according to the sixth embodiment.

FIGS. 18 and 19 are flowcharts showing the processing executed by the Viterbi decoder according to the sixth embodiment. In FIG. 18, the first step executed after the receive signal series is input to the work area 11 is to set the time t to T0 (S601) and the status k to zero (S602).

Then, the ACS circuit 12 reads the branch metrics of the branch $b^t_{2k}$ (branches 0, 1, 4, 5) from any one of the tables 66a to 66d (FIG. 17) corresponding to the receive signal series for the status $S^t_k$, and substitutes it into the algebraic value b1 held in the work area 11 (S603).

The path metric for the past status $S^{t-1}_b$ ($b=b^t_{2k}$) connected with the branch $b^t_{2k}$ (branches 0, 1, 4, 5) is read from the path metric memory 14 using the branch output value of the branch $b^t_{2k}$, and substituted into the algebraic values p0, p1, p4, p5, respectively, held in the work area 11.

Then, the ACS circuit 12 skips S605 and proceeds to step S606 for performing the following calculations using the algebraic values b1, p0, p1, p4, p5 held in the work area 11 and stores each calculation result in the work area 11 (S606).

$$P0=p0+b1;\ P1=p1-b1$$

$$P4=p4+b1;\ P5=p5-b1$$

The ACS circuit 12, as shown in FIG. 19, stores the smaller one of P0 and P1 and the smaller one of P4 and P5 in the path metric memory 14 as a path metric for each status $S^t_k$ (status S0 and status S2) (S607).

Then, the ACS circuit 12 stores the branches for the smaller one of P0 and P1 and the smaller one of P4 and P5 in the path memory 15 (S608).

It is determined whether the character k indicating the status is not less than a predetermined status number (=8) (S609). In the case where k is less than the status number (S609; N), the value k is set to k+8 (S610), and the process returns to step S603.

Once the process returns to step S603, the ACS circuit 12 increments by one the position of the read pointer (read address) not shown, whereby the branch metrics of the branch $b^t_{2k+1}$ (branches 2, 3, 6, 7) for the status $S^t_{k+1}$ (status S1, S4) are read from the address following the address accessed in the preceding step S603, and substituted into the algebraic value b2 held in the work area 11.

The ACS circuit 12 skips S604 and proceeds to step S605, reads from the path metric memory 14 the path metric for the past status $S^{t-1}_b$ ($b=b^t_{2k+1}$) connected with the branch $b^t_{2k+1}$ (branches 2, 3, 6, 7) using the branch output value of the branch $b^t_{2k+1}$, and substitutes them into the algebraic values p2, p3, p6, p7, respectively, held in the work area 11.

Then, the ACS circuit 12 performs the following calculations using the algebraic values b2, p2, p3, p6, p6 held in the work area 11, and stores each calculation result in the work area 11.

$$P2=p2+b2;\ P3=p3-b2$$

$$P6=p6+b2;\ P7=p7-b2$$

As shown in FIG. 19, the ACS circuit 12 then stores the smaller one of P2 and P3 and the smaller one of P6 and P7 in the path metric memory 14 as path metrics for each status $S^t_k$ (status S1 and status S3) (S607).

The ACS circuit 12 stores the branch for the smaller one of P0 and P1 and the smaller one of P4 and P5 in the path memory 15 (S608).

Then, it is determined whether k indicating the status is not less than a predetermined status number (=8) (S609). In the case where it is determined that k is not less than the status number (S609; Y), then the process proceeds to step S611. The process including and subsequent to S611 is substantially the same as the process (S110, S111) in the first embodiment. After that, the code series decoded from the receive signal series finally by back trace are output from the path memory 15 in the same manner as in the first embodiment.

In the Viterbi decoder according to the sixth embodiment, the branch metrics cannot be read out in the order of branches. Nevertheless, the branch metrics for a plurality of status can be read and processed at the same time. As a result, the number of times the branch metric table 66 is accessed can be reduced while at the same time making it possible to sequentially access the branch metric table 66. As compared with the prior art, therefore, the processing speed (decoding speed) of the ACS circuit 12 can be improved.

[Seventh Embodiment]

Now, a Viterbi decoder according to a seventh embodiment of the invention will be explained. The seventh embodiment shares some points with the first and sixth embodiments. Therefore, the explanation that follows will be mainly made only of the difference with the first and sixth embodiments.

In the first to sixth embodiments, the access address of the branch metric table is produced according to the pattern of the receive signal series, and sequentially accessed with the access address as a head, so that the branch metrics of the branches can be read out.

The branch metric table of the receive signal series inverted from the 2-bit code constituting the receive signal series can be determined easily by a simple operation from the values of the branch metrics of the receive signal series before inversion of the 2-bit code. As a result, it is sufficient to acquire the branch metrics corresponding to one of the two types of the receive signal series.

Figure 22:
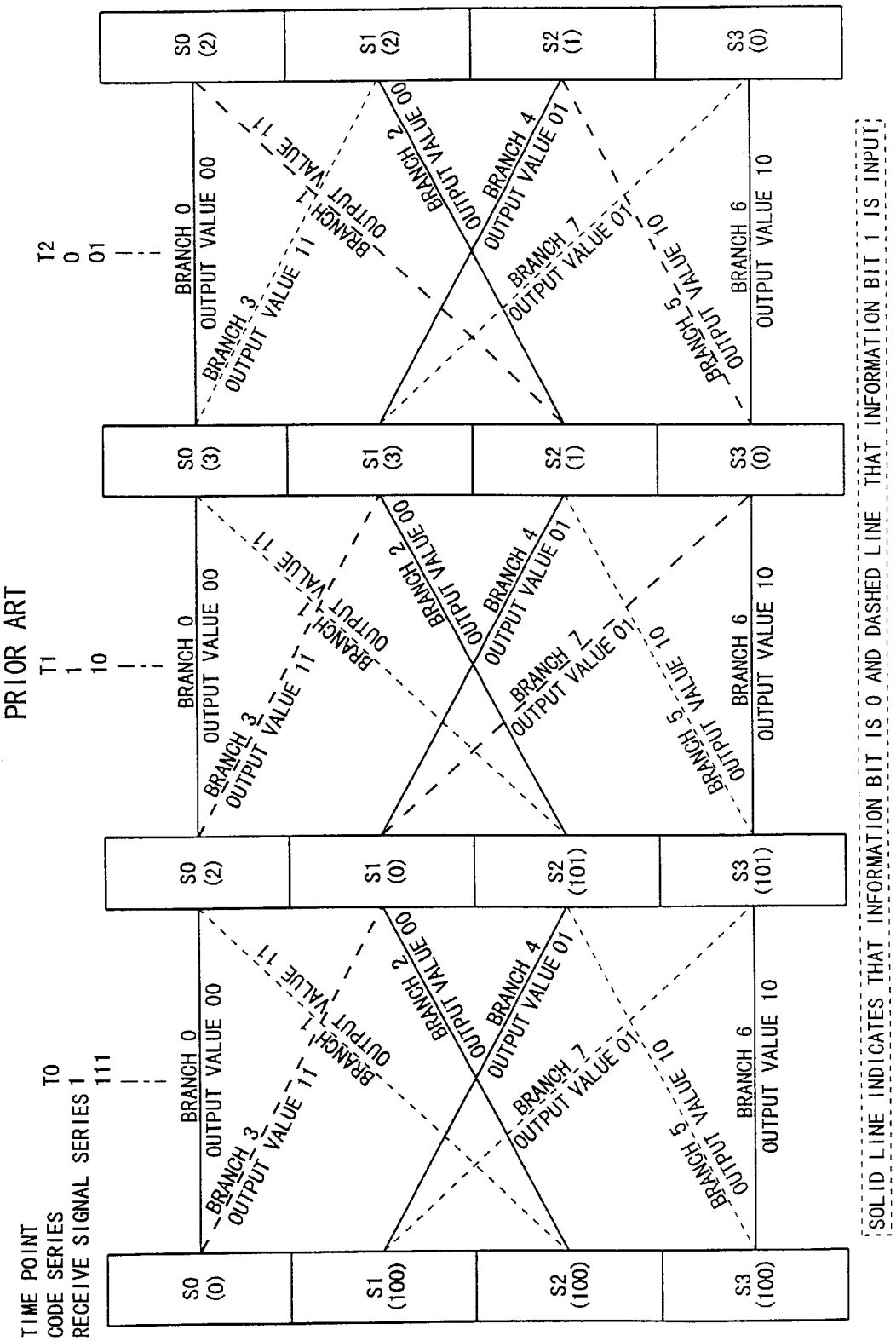
FIG. 22 is a diagram showing an example of the trellis applied to a Viterbi decoder.

In the trellis shown in FIG. 22, for example, assume that the branch metric is the Hamming distance. The branch metric of branch 0 of the receive signal series "00" is zero, while the branch metric of branch 0 of the receive signal series "11" is 2−0=2 (FIG. 2).

In the case of the branch metric converted by the [conversion formula] described with reference to the third embodiment, on the other hand, the branch metric of branch 0 of the receive signal series "00" is −1, while the branch metric of branch 0 of the receive signal series "11" is 1. Utilizing this characteristic, the memory amount of the branch metric table can be reduced as shown in FIG. 20.

Figure 20:
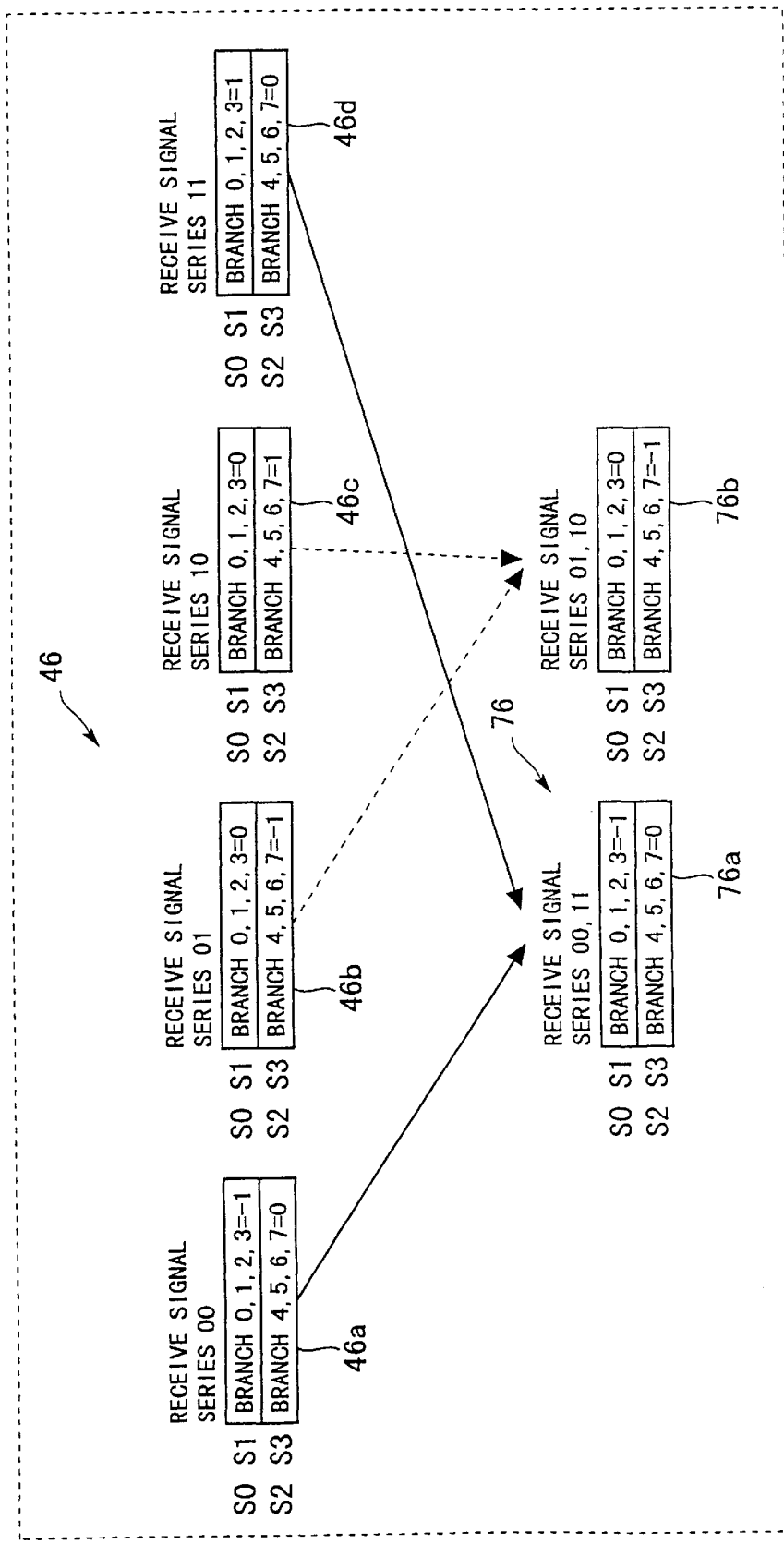
FIG. 20 is a diagram for explaining an example of the branch metric table according to a seventh embodiment.

FIG. 20 is a diagram for explaining an example of the branch metric table 76 according to the seventh embodiment. The branch metric table 76 shown in FIG. 20 is a modification of the branch metric table 46 shown in FIG. 9, and includes a table 76a corresponding to the receive signal series "00" and "11" and a table 76b corresponding to the receive signal series "01" and "10".

The tables 76a, 76b hold the branch metrics corresponding to the branches 0 to 3 for the status S0 and S1 in the first address, and the branch metrics corresponding to the branches 4 to 7 for the status S2 and S3 in the address following the first address.

The Viterbi decoder according to the seventh embodiment has a configuration similar to that of the first embodiment (FIG. 1). The difference, however, is that the branch metric memory 13 holds the branch metric table 76 shown in FIG. 19 instead of the branch metric table 16 (FIG. 2).

The Viterbi decoder according to the seventh embodiment decodes the receive signal series in accordance with the same routine as the processing routine (FIG. 10) explained in the fourth embodiment, and therefore the processing (operation) will not be explained. In the seventh embodiment, however, the branch metric table 76 shown in FIG. 19 is used in place of the branch metric table 46 (FIG. 9) of the fourth embodiment.

With the Viterbi decoder according to the seventh embodiment, as compared with the first to sixth embodiments, the storage capacity of the branch metric memory 13 can be further reduced. By reducing the storage capacity of the branch metric memory 13 of the first to seventh embodiments in this way, the cost of the Viterbi decoder can be reduced.

[Eighth Embodiment]

Now, a Viterbi decoder according to the eighth embodiment of the invention will be explained. The eighth embodiment has some points shared with the first and sixth embodiments, and therefore the difference with the first and sixth embodiments will be mainly described.

In the case where the Viterbi decoder uses the trellis as shown in FIG. 15, the branch metric table is as shown in FIG. 17. In this case, the Viterbi decoder is required to execute the processing shown in FIGS. 18 and 19. In this processing, the ACS circuit 12 cannot read the branch metrics in the order of branches sequentially. In view of this, the Viterbi decoder according to the eighth embodiment performs the following processing.

The Viterbi decoder according to the eighth embodiment has the configuration shown in FIG. 1. The trellis used for the decode processing of the receive signal series varies with the type of the receive signal series and is determined by the negotiation between the receiving and transmitting ends. The ACS circuit 12 of the Viterbi decoder can be informed of the trellis used for the decode processing which is determined by the negotiation between the receiving and transmitting ends.

In the process, assume that the ACS circuit 12 is informed that it is determined by negotiation that the receive signal series is decoded by use of the trellis shown in FIG. 15, the trellis structure is converted by changing the order of the status as shown in FIG. 21.

After that, the ACS circuit 12 produces a branch metric table corresponding to the converted trellis. Specifically, the ACS circuit 12 produces the branch metric table having the same contents as in FIG. 9 in accordance with the converted trellis shown in FIG. 21. After that, the ACS circuit 12 causes the branch metric table thus produced to be held in the work area 11 or the branch metric memory 13.

After that, the Viterbi decoder processes the input receive signal series in the same manner as in FIG. 10, thereby making it possible to read the branch metric table sequentially in the order of branches.

[Miscellaneous]

The Viterbi decoder according to this invention is applicable to the error correcting code (say, RCPC code) subjected to puncture as far as it has a branch metric table for each puncture rate. In such a case, the first to eighth embodiments are not required to be modified in any way.

The Viterbi decoder according to the invention can find wide applications in the field of information processing and communication using the portable telephones or the CD-ROM readers in which the error of the code received as transmitted and received signals is corrected.

What is claimed is:

1. A Viterbi decoder for decoding the receive signal series encoded by an error correcting code, comprising:

a storage unit for storing a plurality of branch metrics; and a control unit for performing, upon receipt of said receive signal series, the processing of selecting a surviving path for each status using the branch metrics stored in said storage unit;

wherein said storage unit stores a plurality of tables prepared in accordance with the pattern of the receive signal series for holding branch metrics corresponding to each status; and wherein each of said tables holds the branch metrics of the two branches entering each status in such a manner as to be read out by said control unit in the order of the branches constituting a trellis.

2. A Viterbi decoder for decoding the receive signal series encoded by an error correcting code, comprising:

a storage unit for storing a plurality of branch metrics; and a control unit for performing, upon receipt of a receive signal series, the processing of selecting a surviving path for each status using the branch metrics stored in said storage unit;

wherein said storage unit stores a plurality of tables prepared in accordance with the pattern of the receive signal series for holding the branch metrics corresponding to each status;

wherein in the case where the branch metric of one of the two branches entering a given status can be determined from the branch metric of the other branch, each table holds only one of said branch metrics; and wherein in the case where only the branch metric of one of the two branches entering a given status is read from a table corresponding to the receive signal series, said control unit determines the other branch metric from said one branch metric.

3. A Viterbi decoder for decoding the receive signal series encoded by an error correcting code, comprising:

a storage unit for storing a plurality of branch metrics; and a control unit for performing, upon receipt of the receive signal series, the processing of selecting a surviving path for each status by calculating the path metrics corresponding to the two branches entering each status using the branch metrics stored in said storage unit;

wherein said storage unit stores a plurality of tables prepared according to the pattern of the receive signal series for holding the branch metrics corresponding to each status;

wherein each of said tables holds the branch metric of only one of the two branches converted into symmetry about zero and entering a given status as a branch metric corresponding to the status; and wherein in the case where only one of the branch metrics of the two branches converted to be symmetric about zero and entering a given status is read from a table corresponding to the receive signal series, said control unit calculates the path metric corresponding to the two branches entering each status using said one of the branch metrics.

4. A Viterbi decoder for decoding the receive signal series encoded by an error correcting code, comprising:

a storage unit for storing a plurality of branch metrics; and a control unit for performing, upon receipt of the receive series, the processing of selecting a surviving path for each status by calculating the path metrics corresponding to the two branches entering each status using the branch metrics stored in said storage unit;

wherein said storage unit stores a plurality of tables prepared in accordance with the pattern of the receive signal series for holding the branch metrics corresponding to each status;

wherein each table holds one of said branch metrics of the two branches entering a given status as a branch metric corresponding to each status by which the other branch metric can be determined, and further holds a group of adjoining status having the same branch metric; and wherein said control unit reads said grouped branch metrics from the table corresponding to the receive signal series and calculates the path metric for each status corresponding to the branch metric thus read.

5. A Viterbi decoder for decoding the receive signal series encoded by an error correcting code, comprising:

a storage unit for storing a plurality of branch metrics; and a control unit for performing, upon receipt of the receive signal series, the processing of selecting a surviving path for each status by calculating the path metrics corresponding to the two branches entering each status using the branch metrics stored in said storage unit;

wherein said storage unit stores a plurality of tables prepared in accordance with the pattern of the receive signal series for holding the branch metrics corresponding to each status;

wherein in the case where each table holds one of said branch metrics of the two branches entering a given status as a branch metric corresponding to each status by which the other branch metric can be determined, said table further grouping and holding adjoining status having the branch metrics of the same positive and negative values; and wherein said control unit reads said grouped branch metrics from the table corresponding to the receive signal series and calculates the path metric for each status corresponding to the branch metrics thus read.

6. A Viterbi decoder for decoding the receive signal series encoded by an error correcting code, comprising:

a storage unit for storing a plurality of branch metrics; and a control unit for performing, upon receipt of the receive signal series, the processing of selecting a surviving path for each status by calculating the path metrics corresponding to the two branches entering each status using the branch metrics stored in said storage unit;

wherein said storage unit stores a plurality of tables prepared in accordance with the pattern of the receive signal series for holding the branch metrics corresponding to each status;

wherein in the case where one of the branch metrics of the two branches entering a given status can be determined from the other branch metric as a branch metric corresponding to each status, each table holds said one of said branch metrics and further groups and holds the status other than the adjoining status having neither the same branch metrics nor positive and negative branch metrics of the same opposite value; and wherein said control unit reads said grouped branch metrics from the table corresponding to the receive signal series and calculates the path metric for each status corresponding to the branch metric thus read.

7. A Viterbi decoder for decoding the receive signal series encoded by an error correcting code, comprising:

a storage unit for storing a plurality of branch metrics; and a control unit for performing, upon receipt of the receive signal series, the processing of selecting a surviving path for each status using the branch metrics stored in said storage unit;

wherein said storage unit stores a common table shared by a specific receive signal series and a receive signal series having a pattern inverted from said specific receive signal series; and wherein said control unit, upon receipt of the specific receive signal series or the receive signal series having a pattern inverted from said specific receive signal series, reads the branch metrics stored in said table and performs the process of selecting a surviving path for each status.

8. A Viterbi decoder for decoding a receive signal series encoded by an error correcting code, comprising:

a storage unit for storing a plurality of branch metrics; and a control unit for performing, upon receipt of the receive signal series, the processing of selecting a surviving path for each status by calculating the path metric corresponding to the two branches entering each status using the branch metrics stored in said storage unit;

wherein in the case where the trellis determined by the negotiation with the transmitting end of the receive signal series and used for decoding the receive signal series is such that said control unit cannot read, by sequential access, the branch metrics for each status corresponding to the receive signal series input to said control unit, said control unit converts the structure of said trellis into a state capable of being read by sequential access and produces a table for holding the branch metrics for each status corresponding to the trellis having the structure thereof converted.

* * * * *